United States Patent
Eguchi et al.

(10) Patent No.: US 12,498,638 B2
(45) Date of Patent: Dec. 16, 2025

(54) MONOMER, RESIN FOR PHOTORESIST, RESIN COMPOSITION FOR PHOTORESIST, AND PATTERN FORMING METHOD

(71) Applicant: DAICEL CORPORATION, Osaka (JP)

(72) Inventors: Akira Eguchi, Tokyo (JP); Kazuhiro Uehara, Tokyo (JP); Masayoshi Furukawa, Tokyo (JP); Takashi Maruyama, Tokyo (JP)

(73) Assignee: DAICEL CORPORATION, Osaka (JP)

( * ) Notice: Subject to any disclaimer, the term of this patent is extended or adjusted under 35 U.S.C. 154(b) by 510 days.

(21) Appl. No.: 17/631,238

(22) PCT Filed: Jun. 18, 2020

(86) PCT No.: PCT/JP2020/023976
§ 371 (c)(1),
(2) Date: Jan. 28, 2022

(87) PCT Pub. No.: WO2021/019942
PCT Pub. Date: Feb. 4, 2021

(65) Prior Publication Data
US 2022/0267494 A1 Aug. 25, 2022

(30) Foreign Application Priority Data
Jul. 30, 2019 (JP) .................. 2019-139399

(51) Int. Cl.
*G03F 7/039* (2006.01)
*C07D 313/06* (2006.01)
(Continued)

(52) U.S. Cl.
CPC ......... *G03F 7/0397* (2013.01); *C07D 313/06* (2013.01); *C07D 321/10* (2013.01);
(Continued)

(58) Field of Classification Search
CPC ........ G03F 7/0397; G03F 7/30; C08F 224/00; C08F 220/22; C08F 220/24;
(Continued)

(56) References Cited

U.S. PATENT DOCUMENTS 7,750,101 B2   7/2010   Inoue et al.
7,834,114 B2   11/2010  Inoue et al.
(Continued)

FOREIGN PATENT DOCUMENTS

JP   10-274852 A     10/1998
JP   2000-26446 A    1/2000
(Continued)

OTHER PUBLICATIONS

CAS Registry No. 2586061-95-0 (Year: 2021).*
(Continued)

*Primary Examiner* — John S. Chu
(74) *Attorney, Agent, or Firm* — Birch, Stewart, Kolasch & Birch, LLP

(57) ABSTRACT

Provided is a monomer that improves solubility in organic solvents, hydrolyzability, and solubility in water after hydrolysis of a resin as well as imparts higher heat resistance to a resin. A resin for a photoresist containing a polymerization unit represented by Formula (Y), wherein $R^h$ represents a halogen atom or an alkyl group having from 1 to 6 carbons and having a halogen atom; $R^1$ is a substituent attached to a ring and represents a halogen atom, an alkyl group that has from 1 to 6 carbons and may have a halogen atom, a hydroxyalkyl group that has from 1 to 6 carbons and may have a halogen atom and has a hydroxyl group moiety which may be protected by a protecting group, a carboxyl group that may form a salt, or a substituted oxycarbonyl group; A represents an alkylene group having from 1 to 6 carbons, an oxygen atom, a sulfur atom, or no bond; m is the number of
(Continued)

$R^1$ and represents an integer from 0 to 8; X represents an electron-withdrawing substituent; n is the number of X and represents an integer from 1 to 9; B represents a single bond or a linking group; and a steric position of a COOB-group attached to a polymer chain may be either endo or exo.

14 Claims, 2 Drawing Sheets

(51) Int. Cl.
  C07D 321/10    (2006.01)
  C07D 327/02    (2006.01)
  C07D 407/14    (2006.01)
  C07D 411/14    (2006.01)
  C08F 220/28    (2006.01)
  C08F 224/00    (2006.01)
  G03F 7/20      (2006.01)
  G03F 7/30      (2006.01)

(52) U.S. Cl.
  CPC ......... *C07D 327/02* (2013.01); *C07D 407/14* (2013.01); *C07D 411/14* (2013.01); *C08F 220/283* (2020.02); *C08F 224/00* (2013.01); *G03F 7/039* (2013.01); *G03F 7/20* (2013.01); *G03F 7/30* (2013.01)

(58) Field of Classification Search
  CPC . C08F 220/382; C07D 313/06; C07D 321/10; C07D 327/02; C07D 411/14; C07D 407/14
  See application file for complete search history.

(56) References Cited

U.S. PATENT DOCUMENTS

| | | | |
|---|---|---|---|
| 8,236,971 B2 | 8/2012 | Inoue et al. | |
| 8,709,704 B2 | 4/2014 | Kamimura et al. | |
| 2006/0105267 A1* | 5/2006 | Khojasteh ............. | G03F 7/0397 430/270.1 |
| 2007/0160929 A1 | 7/2007 | Hasegawa et al. | |
| 2008/0319160 A1 | 12/2008 | Inoue et al. | |
| 2010/0056663 A1* | 3/2010 | Ito ........................ | C07D 303/30 568/733 |
| 2010/0081079 A1* | 4/2010 | Joo ........................ | G03F 7/0045 526/270 |
| 2010/0081778 A1 | 4/2010 | Inoue et al. | |
| 2010/0323296 A1* | 12/2010 | Ichikawa ................ | G03F 7/038 430/286.1 |
| 2011/0028743 A1 | 2/2011 | Inoue et al. | |
| 2011/0229832 A1 | 9/2011 | Kamimura et al. | |
| 2013/0107235 A1* | 5/2013 | Namai .................... | G03F 7/405 355/27 |
| 2016/0185999 A1* | 6/2016 | Namai .................... | G03F 7/2037 524/544 |
| 2016/0363859 A1* | 12/2016 | Namai .................... | G03F 7/0045 |
| 2022/0082938 A1 | 3/2022 | Ushiyama et al. | |

FOREIGN PATENT DOCUMENTS

| | | |
|---|---|---|
| JP | 2005-8756 A | 1/2005 |
| JP | 2005-325293 A | 11/2005 |
| JP | 2007-182488 A | 7/2007 |
| JP | 2008-231059 A | 10/2008 |
| JP | 2010-152353 A | 7/2010 |
| JP | 2010-164958 A | 7/2010 |
| JP | 4740951 B2 | 8/2011 |
| KR | 10-2022-0007666 A | 1/2022 |
| WO | WO 2020/241099 A1 | 12/2020 |

OTHER PUBLICATIONS

CAS Registry No. 2564789-00-8 (Year: 2021).*
International Preliminary Report on Patentability and Written Opinion of the International Searching Authority (Forms PCT/IB/373 and PCT/ISA/237) for International Application No. PCT/JP2020/023976, dated Feb. 1, 2022, with an English translation.
International Search Report (Form PCT/ISA/210) for International Application No. PCT/JP2020/023976, dated Sep. 1, 2020, with an English translation.
Japanese Office Action for Japanese Application No. 2021-536653, dated Jul. 9, 2024.
Korean Office Action for Korean Application No. 10-2022-7005867, dated May 13, 2025.

* cited by examiner

MONOMER, RESIN FOR PHOTORESIST, RESIN COMPOSITION FOR PHOTORESIST, AND PATTERN FORMING METHOD

TECHNICAL FIELD

The present invention relates to a monomer, a resin, a resin composition, and a pattern forming method. The present application claims priority to JP 2019-139399 filed in Japan on Jul. 30, 2019, the content of which is incorporated herein.

BACKGROUND ART

In the manufacturing of semiconductors, significant innovations are being made in lithographic techniques for pattern formation. Initially, the i-line and g-line were used for exposure in lithography, and pattern line widths were wide, and therefore the capacity of semiconductors that were produced was low. However, recent developments in technology have enabled the use of a KrF excimer laser of a short wavelength and an ArF excimer laser of an even shorter wavelength, and the pattern line width is rapidly reduced.

For exposure using a KrF excimer laser, a novolac or styrene-based resin has been used, but the resin contains an aromatic group, and causes a problem of absorption of the laser light from the ArF excimer laser. Therefore, for exposure using an ArF excimer laser, a resin that does not contain an aromatic group (e.g., a resin having an alicyclic skeleton) is used instead of a resin that contains an aromatic group. The resins that are used for exposure using an ArF excimer laser are mainly acrylic resins. This is an application of the following mechanism: in using a resin composition containing an acrylic resin and a radiation-sensitive acid generator, the acrylic resin containing a (meth)acrylic acid protected by a protecting group as a monomer unit, exposing the resin composition to light generates an acid, which eliminates the protecting group in the monomer unit to form a carboxyl group, and thus making the resin alkali-soluble.

Although many of the protecting groups that are currently used are groups having a non-polar alicyclic skeleton, such protecting groups exhibit poor adhesion to a substrate and lack affinity to alkaline developing solutions. Thus, numerous proposals have been made for acrylic monomers having a polar alicyclic skeleton (e.g., those having an ester group). Among them, acrylic monomers having a lactone ring have been highly appreciated for their functionality, and many of such acrylic monomers are used (Patent Documents 1 and 2).

In the acrylic monomer described above, the lactone ring is introduced to be hydrolyzed with alkali. However, because of low hydrolyzability of the lactone ring, such an acrylic monomer has a problem of failing to exhibit the desired function sufficiently in some applications. For example, when a resin into which the acrylic monomer is introduced as a polymerization unit is used for resist application, the hydrolysis of the lactone ring with alkali does not proceed sufficiently, and thus this has caused a problem, such as worsening precision of pattern formation. To solve such a problem, acrylic monomers in which a specific electron-withdrawing substituent is introduced into a lactone skeleton have been proposed (Patent Documents 3 and 4).

Pattern formation is completed through: pre-baking including applying a resist (resin for a photoresist) onto a wafer, and heating the wafer to solidify the resist; exposure including irradiating the solidified resist with light to cause a reaction; development (rinse) including immersing the exposed wafer in a developing solution to remove the excess resist; and post-baking including heating the wafer after development. The resist is to be exposed to high temperatures in the pre-baking and the post-baking, but a resist with low heat resistance would decompose and lead to deterioration of line edge roughness.

CITATION LIST

Patent Document

Patent Document 1: JP 2000-026446 A
Patent Document 2: JP 10-274852 A
Patent Document 3: JP 4740951 B
Patent Document 4: JP 2008-231059 A:

SUMMARY OF INVENTION

Technical Problem

With the increasingly finer patterns in recent years, further improvement of line edge roughness is required; however, the resins containing a monomer as a constituent unit proposed in Patent Documents 1 to 4 have been found to have low heat resistance and thus result in insufficient line edge roughness. Thus, there is a demand for resins with higher heat resistance.

Thus, an object of the present invention is to provide a monomer that improves solubility in organic solvents and hydrolyzability of a resin as well as imparts higher heat resistance to a resin. Another object of the present invention is to provide a resin having high solubility in organic solvents and high hydrolyzability, and having higher heat resistance; and a resin composition containing the resin. Yet another object of the present invention is to provide a method that can form a fine pattern with good precision by using the resin composition.

Solution to Problem

As a result of diligent research to achieve the objects described above, the present inventors discovered that introducing a monomer having a specific structure into a resin improves hydrolyzability of a lactone ring of the resin and also improves heat resistance of the resin. The present invention was completed based on these findings.

That is, the present invention provides a resin containing a polymerization unit represented by Formula (Y):

[Chem. 1]

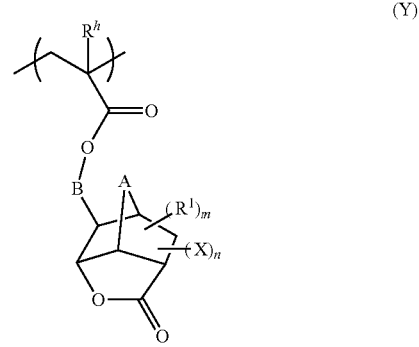

where $R^h$ represents a halogen atom or an alkyl group having from 1 to 6 carbons and having a halogen atom; $R^1$ is a substituent attached to a ring and represents a halogen atom, an alkyl group that has from 1 to 6 carbons and may have a halogen atom, a hydroxyalkyl group that has from 1 to 6 carbons and may have a halogen atom and has a hydroxyl group moiety which may be protected by a protecting group, a carboxyl group that may form a salt, or a substituted oxycarbonyl group; A represents an alkylene group having from 1 to 6 carbons, an oxygen atom, a sulfur atom, or no bond; m is the number of $R^1$ and represents an integer from 0 to 8; X represents an electron-withdrawing substituent; n is the number of X and represents an integer from 1 to 9; B represents a single bond or a linking group; and a steric position of a COOB-group attached to a polymer chain may be either endo or exo.

The resin preferably further contains at least one type of polymerization unit selected from the group consisting of polymerization units represented by Formulas (a1) to (a4):

[Chem. 2]

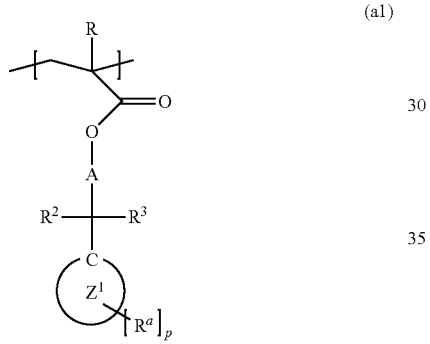

(a1)

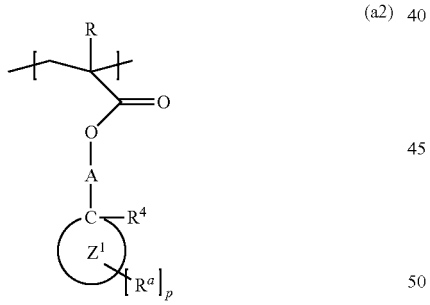

(a2)

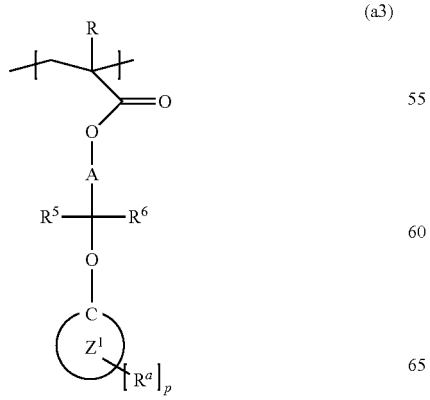

(a3)

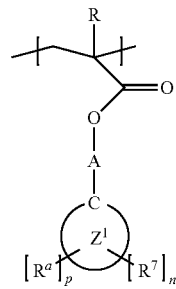

(a4)

where R represents a hydrogen atom, a halogen atom, or an alkyl group that has from 1 to 6 carbons and may have a halogen atom; A represents a single bond or a linking group; $R^2$ to $R^4$ are identical or different and represent an alkyl group that has from 1 to 6 carbons and may have a substituent, where $R^2$ and $R^3$ may be bonded to each other to form a ring; $R^5$ and $R^6$ are identical or different and represent a hydrogen atom or an alkyl group that has from 1 to 6 carbons and may have a substituent; $R^7$ represents a —COOR$^e$ group, and the $R^e$ represents a tertiary hydrocarbon group that may have a substituent, a tetrahydrofuranyl group, a tetrahydropyranyl group, or an oxepanyl group; n represents an integer from 1 to 3; $R^a$ is a substituent attached to a ring $Z^1$, the substituents being identical or different, and represents an oxo group, an alkyl group, a hydroxy group that may be protected by a protecting group, a hydroxyalkyl group that may be protected by a protecting group, or a carboxy group that may be protected by a protecting group; p represents an integer from 0 to 3; and the ring $Z^1$ represents an alicyclic hydrocarbon ring having from 3 to 20 carbons.

The resin preferably further contains at least one type of polymerization unit selected from the group consisting of polymerization units represented by Formulas (b1) to (b5) with the proviso that the polymerization unit corresponding to the polymerization unit represented by Formula (Y) is excluded:

[Chem. 3]

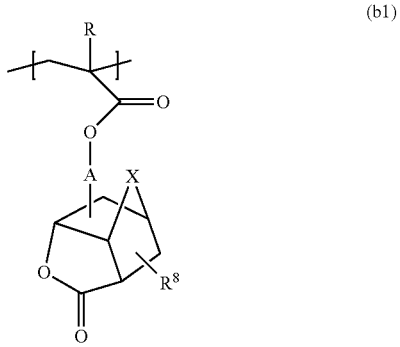

(b1)

-continued

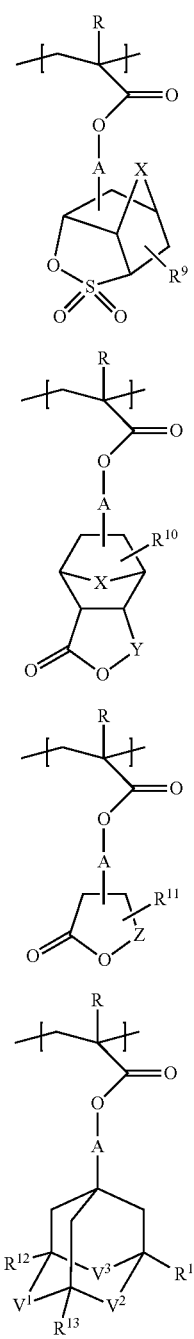

(b2)
(b3)
(b4)
(b5)

where R represents a hydrogen atom, a halogen atom, or an alkyl group that has from 1 to 6 carbons and may have a halogen atom; A represents a single bond or a linking group; X represents no bond, a methylene group, an ethylene group, an oxygen atom, or a sulfur atom; Y represents a methylene group or a carbonyl group; Z represents a divalent organic group; $V^1$ to $V^3$ are identical or different and represent —$CH_2$—, [—C(=O)—], or [—C(=O)—O—] with the proviso that at least one of $V^1$ to $V^3$ is [—C(=O)—O—]; and $R^8$ to $R^{14}$ are identical or different and represent a hydrogen atom, a fluorine atom, an alkyl group that may have a fluorine atom, a hydroxy group that may be protected by a protecting group, a hydroxyalkyl group that may be protected by a protecting group, a carboxy group that may be protected by a protecting group, or a cyano group.

The resin preferably further contains a polymerization unit represented by Formula (c1)

[Chem. 4]

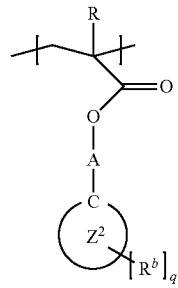

(c1)

where R represents a hydrogen atom, a halogen atom, or an alkyl group that has from 1 to 6 carbons and may have a halogen atom; A represents a single bond or a linking group; $R^b$ represents a hydroxy group that may be protected by a protecting group, a hydroxyalkyl group that may be protected by a protecting group, a carboxy group that may be protected by a protecting group, or a cyano group; q represents an integer from 1 to 5; and a ring $Z^2$ represents an alicyclic hydrocarbon ring having from 6 to 20 carbons.

In addition, the present invention provides a resin composition containing at least the resin and a radiation-sensitive acid generator.

Furthermore, the present invention provides a pattern forming method including at least: applying the composition to a substrate to form a coating film; exposing the coating film to light; and then dissolving the coating film with alkali.

Moreover, the present invention provides a monomer represented by Formula (X):

[Chem. 5]

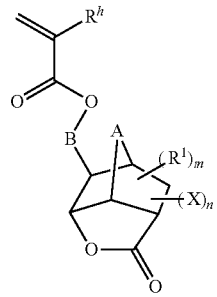

(X)

where $R^h$ represents a halogen atom or an alkyl group having from 1 to 6 carbons and having a halogen atom; $R^1$ is a substituent attached to a ring and represents a halogen atom, an alkyl group that has from 1 to 6 carbons and may have a halogen atom, a hydroxyalkyl group that has from 1 to 6 carbons and may have a halogen atom and has a hydroxyl group moiety which may be protected by a protecting group, a carboxyl group that may form a salt, or a substituted oxycarbonyl group; A represents an alkylene group having from 1 to 6 carbons, an oxygen atom, a sulfur atom, or no bond; m is the number of $R^1$ and represents an integer from 0 to 8; X represents an electron-withdrawing substituent; n is the number of X and represents an integer from 1 to 9; B represents a single bond or a linking group; and a steric position of a $CH_2=C(R^h)COOB$-group may be either endo or exo.

Advantageous Effects of Invention

The present invention provides the monomer that improves solubility in organic solvents and hydrolyzability of a resin as well as imparts higher heat resistance to a resin. In addition, the present invention provides the resin having high solubility in organic solvents and high hydrolyzability as well as having higher heat resistance; and the resin composition containing the resin. Furthermore, the present invention provides the method that can form a fine pattern with good precision using the resin composition.

DESCRIPTION OF EMBODIMENTS

Monomer

Figure 1:
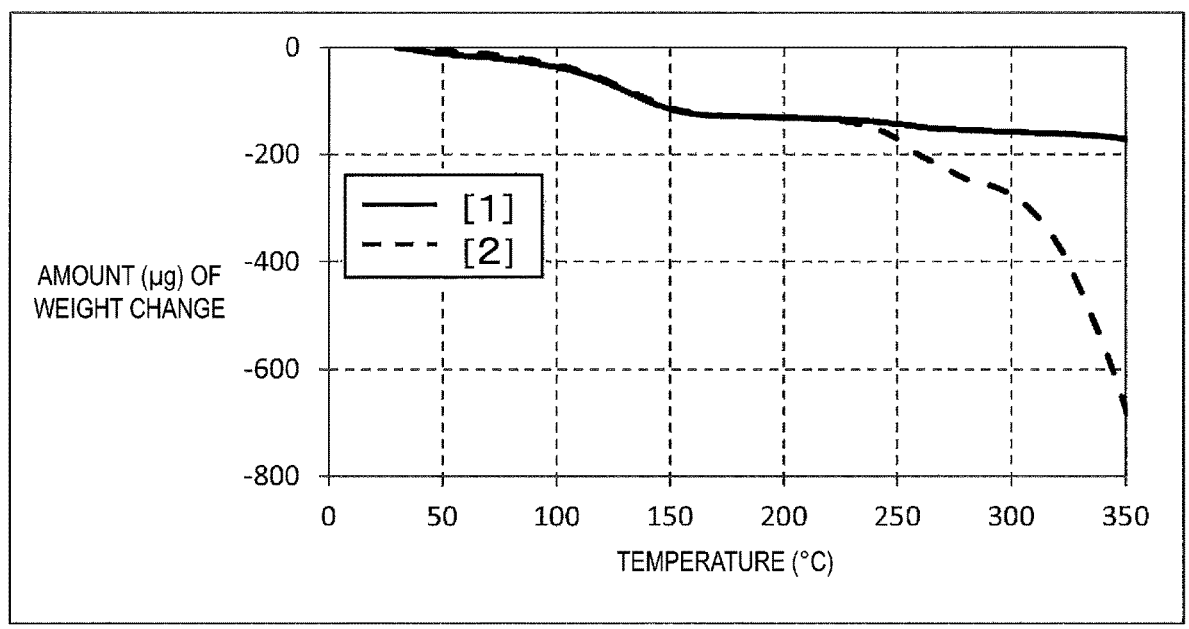
FIG. 1 is a graph showing results of thermogravimetric measurements of resins in Example 2 and Comparative Example 1. The solid line [1] shows results of Example 2, and the dashed line [2] shows results of Comparative Example 1. The vertical axis shows the amount (ug) of weight change, and the horizontal axis shows the temperature (° C.).

A monomer according to an embodiment of the present invention is a polycyclic ester represented by Formula (X) below having an electron-withdrawing substituent and a lactone skeleton:

[Chem. 6]

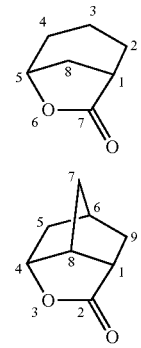

(X)

where, in Formula (X), $R^h$ represents a halogen atom or an alkyl group having from 1 to 6 carbons and having a halogen atom; $R^1$ is a substituent attached to [a 6-oxabicyclo[3.2.1$^{1,5}$] octane ring (when A is not a bond), a 3-oxatricyclo[4.2.1.0$^{4,8}$] nonane ring (when A is a methylene group), or the like] and represents a halogen atom, an alkyl group that has from 1 to 6 carbons and may have a halogen atom, a hydroxyalkyl group that has from 1 to 6 carbons and may have a halogen atom and has a hydroxyl group moiety which may be protected by a protecting group, a carboxyl group that may form a salt, or a substituted oxycarbonyl group; A represents an alkylene group having from 1 to 6 carbons, an oxygen atom, a sulfur atom, or no bond; m is the number of $R^1$ and represents an integer from 0 to 8; X represents an electron-withdrawing substituent; and n is the number of X attached to [a 6-oxabicyclo [3.2.1$^{1,5}$] octane ring (when A is not a bond), a 3-oxatricyclo[4.2.1.0$^{4,8}$] nonane ring (when A is a methylene group), or the like] and represents an integer from 1 to 9; B represents a single bond or a linking group; and a steric position of a $CH_2=C(R^h)COOB$-group may be either endo or exo.

The position numbers on the 6-oxabicyclo[3.2.1$^{1,5}$] octane ring and the position numbers on the 3-oxatricyclo [4.2.1.0$^{4,8}$] nonane ring are shown below (The former on the left and the latter on the right).

[Chem. 7]

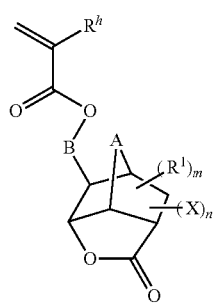

In Formula (X), X represents an electron-withdrawing substituent, and examples of the electron-withdrawing group include halogen atoms, such as a fluorine atom; halogenated hydrocarbon groups, such as a trifluoromethyl group; a carboxyl group; alkoxycarbonyl groups, such as a methoxycarbonyl group; aryloxycarbonyl groups, such as a phenoxycarbonyl group; acyl groups, such as an acetyl group; a cyano group; aryl groups; 1-alkenyl groups; a nitro group; alkyl sulfonate groups; sulfonic acids; sulfone groups; and sulfoxy groups. Among these, a fluorine atom or a fluorine atom-containing group, such as a trifluoromethyl group; a carboxyl group; an alkoxycarbonyl group, such as a methoxycarbonyl group; an acyl group, such as an acetyl group; a cyano group and a nitro group are preferred.

The halogen atom in $R^h$ is not particularly limited, but from the viewpoint of improving heat resistance, a fluorine atom or a chlorine atom is preferred, and a fluorine atom is more preferred. In addition, the number of the carbon in the alkyl group in $R^h$ is not particularly limited as long as the alkyl group has from 1 to 6 carbons, but the alkyl group has preferably from 1 to 3 carbons and more preferably 1 or 2 carbons. That is, from the viewpoint of improving heat resistance, the alkyl group having from 1 to 6 carbons and having a halogen atom in $R^h$ is preferably a fluorine atom-substituted alkyl group having 1 or 2 carbons, such as a fluoromethyl group, a difluoromethyl group, a trifluoromethyl group, a 2,2,2-trifluoroethyl group, or a 1,1,2,2,2-pentafluoroethyl group, and is more preferably a trifluoromethyl group.

Although the reason why the heat resistance of the resin into which the monomer represented by Formula (X) is introduced improves is not clear, but this is presumably related to $R^h$; that is, Rb is a halogen atom or an alkyl group having from 1 to 6 carbons and having a halogen atom, and this makes the main chain of the resin containing the polymerization unit derived from the monomer (i.e., the polymerization unit represented by Formula (Y)) less likely to be cleaved. A monomer represented by Formula (X) where $R^h$ is fluorine is described as an example. The C—F bond has a higher binding energy than the C—H bond, thus the rotation of the carbon atom to which the fluorine atom is bonded and the carbon atom adjacent to that carbon atom, that is, the C—C bond in the main chain of the resin, is restrained, and this makes the C—C bond less likely to be cleaved. A monomer represented by Formula (X) where $R^h$ is a fluoromethyl group will be described as an example. The C—F bond has a higher binding energy than the C—H bond as described above, thus the rotation of the C—C bond in the main chain is restrained, and in addition, the rotation is also restrained by the steric hindrance of the fluoromethyl group, and this makes the C—C bond less likely to be cleaved. In addition, not only that $R^h$ is the substituent described above but also that the monomer represented by Formula (X) has an electron-withdrawing substituent and a lactone skeleton is presumably related closely to the improvement of heat resistance of the resin.

The halogen atom in $R^1$ is not particularly limited and is, for example, a fluorine atom or a chlorine atom. In addition, the number of the carbon in the alkyl group in $R^1$ is not particularly limited as long as the alkyl group has from 1 to 6 carbons, but the alkyl group has preferably from 1 to 3 carbons and more preferably 1 or 2 carbons. That is, examples of the alkyl group having from 1 to 6 carbons and having a halogen atom in $R^1$ is preferably a fluorine atom-substituted alkyl group having 1 or 2 carbons, such as a fluoromethyl group, a difluoromethyl group, a trifluoromethyl group, a 2,2,2-trifluoroethyl group, and a 1,1,2,2,2-pentafluoroethyl group.

Examples of the hydroxyalkyl group having from 1 to 6 carbons in $R^1$ include hydroxymethyl, 2-hydroxyethyl, 1-hydroxyethyl, 3-hydroxypropyl, 2-hydroxypropyl, 4-hydroxybutyl, and 6-hydroxyhexyl groups. Examples of the hydroxyalkyl group having from 1 to 6 carbons and having a halogen atom include difluorohydroxymethyl, 1,1-difluoro-2-hydroxyethyl, 2,2-difluoro-2-hydroxyethyl, and 1,1,2,2-tetrafluoro-2-hydroxyethyl groups. Among the hydroxyalkyl groups that have from 1 to 6 carbons and may have a halogen atom, a hydroxyalkyl group or hydroxyhaloalkyl group having 1 or 2 carbons (particularly 1 carbon) is preferred. Examples of the protecting group for the hydroxyl group of the hydroxyalkyl group that has from 1 to 6 carbons and may have a halogen atom includes protecting groups commonly used as a protecting group for a hydroxyl group in the field of organic synthesis, for example, a group that forms an ether or acetal bond together with the oxygen atom constituting the hydroxyl group, such as a methyl group or a methoxymethyl group; and a group that forms an ester bond together with the oxygen atom constituting the hydroxyl group, such as an acetyl group or a benzoyl group. Examples of the salt of the carboxyl group include alkali metal salts, alkaline earth metal salts, and transition metal salts.

Examples of the substituted oxycarbonyl group in $R^1$ include alkoxycarbonyl groups (such as $C_{1-4}$ alkoxy-carbonyl groups), such as methoxycarbonyl, ethoxycarbonyl, isopropyloxycarbonyl, and propoxycarbonyl groups; alkenyloxycarbonyl groups (such as $C_{2-4}$ alkoxy-carbonyl groups), such as vinyloxycarbonyl and allyloxycarbonyl groups; cycloalkyloxycarbonyl groups, such as a cyclohexyloxycarbonyl group; and aryloxycarbonyl groups, such as a phenyloxycarbonyl group.

A represents an alkylene group having from 1 to 6 carbons, an oxygen atom, a sulfur atom, or no bond. Examples of the alkylene group having from 1 to 6 carbons include a methylene group that may be an alkyl group-substituted methylene group, an ethylene group that may be an alkyl group-substituted ethylene group, and a propylene group that may be an alkyl group-substituted propylene group. Among these, A is preferably an alkylene group having from 1 to 6 carbons or no bond.

m is any integer from 0 to 8 and not particularly limited but is, for example, preferably of 0 to 6 and more preferably from 0 to 3. When a plurality of $R^1$ is contained, these may be identical or different. n is any integer from 1 to 9 and not particularly limited but is, for example, preferably from 1 to 5 and more preferably 1 or 2. When a plurality of X is contained, they may be identical or different. When A is not a bond, the substituent X may be attached to any position of the 1-, 2-, 3-, 4-, 5-, and 8-positions of the 6-oxabicyclo[3.2.1$^{1,5}$] octane ring, but is attached preferably to the 1-position (α-position of the lactone) or the 2-position, and particularly preferably to the 1-position (α-position of the lactone). When A is an alkylene group having from 1 to 6 carbons, an oxygen atom, or a sulfur atom, the substituent X may be attached to any position of the 1-, 4-, 5-, 6-, 7-, 8-, 9-positions and the like of the 3-oxatricyclo[4.2.1.0$^{4,8}$] nonane ring or the like, but is attached preferably to the 1-position or 9-position (or a position corresponding to these) of the 3-oxatricyclo[4.2.1.0$^{4,8}$] nonane ring or the like, and particularly preferably to the 1-position (or a position corresponding to this; a-position of the lactone).

B represents a single bond or a linking group. Examples of the linking group include a carbonyl group (—C(=O)—), an ether bond (—O—), an ester bond (—C(=O)—O—), an amide bond (—C(=O)—NH—), a carbonate bond (—O—C(=O)—O—), a group in which a plurality of these groups are linked, and a group in which an alkylene group and these groups are bonded. Examples of the alkylene group include linear or branched alkylene groups, such as methylene, methylmethylene, a dimethylmethylene, ethylene, propylene, and trimethylene groups; and divalent alicyclic hydrocarbon groups (especially divalent cycloalkylene groups), such as 1,2-cyclopentylene, 1,3-cyclopentylene, cyclopentylidene, 1,2-cyclohexylene, 1,3-cyclohexylene, 1,4-cyclohexylene, and cyclohexylidene groups.

Representative examples of the monomer represented by Formula (X) include compounds represented by the formulas below including 1-substituent X-6-oxabicyclo[3.2.1$^{1,5}$] octan-7-one compounds (including each stereoisomer), 2-substituent X-6-oxabicyclo[3.2.1$^{1,5}$] octan-7-one compounds (including each stereoisomer), 1-substituent X-5-(meth)acryloyloxy-3-oxatricyclo[4.2.1.0$^{4,8}$] nonan-2-one compounds (including each stereoisomer), 9-substituent X-5-(meth)acryloyloxy-3-oxatricyclo[4.2.1.0$^{4,8}$] nonan-2-one compounds (including each stereoisomer), and compounds corresponding to these in which A in Formula (X) is an alkylene group other than a methylene group, an oxygen atom, or a sulfur atom. In the formulas, R represents an acryloyl group or a methacryloyl group, and Ac represents an acetyl group. The substituent X represents an electron-withdrawing substituent.

[Chem. 8]

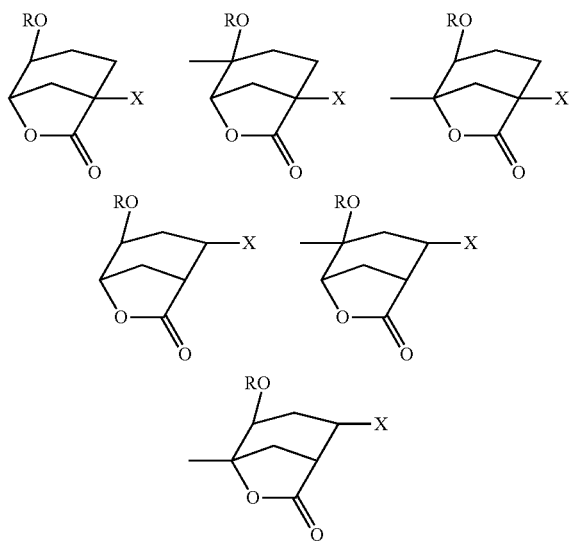

[Chem. 9]

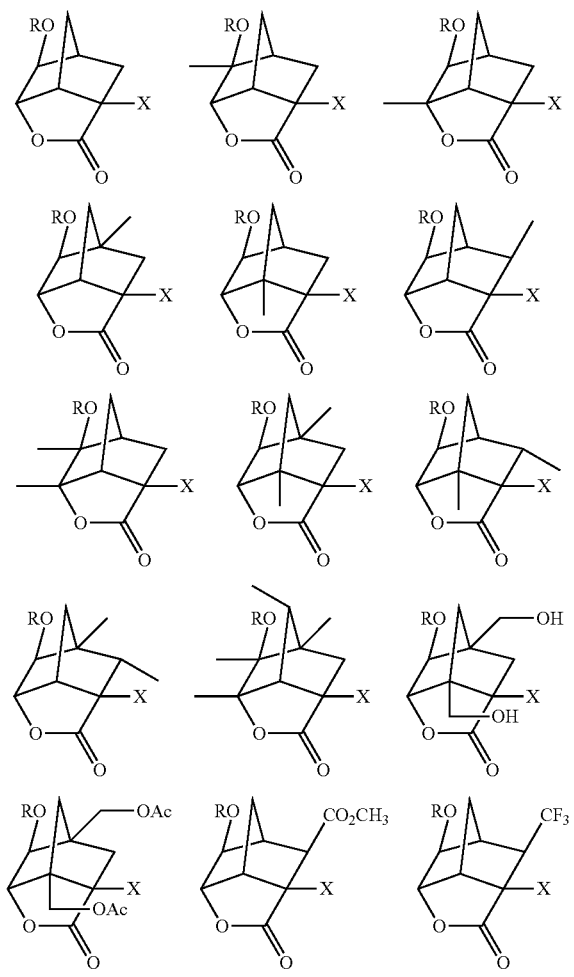

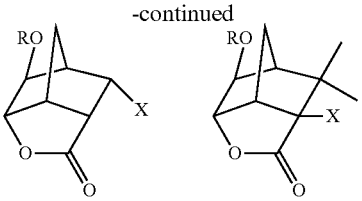

The monomer represented by Formula (X) can be manufactured, for example, by reacting a polycyclic alcohol, represented by Formula (X1) below, having an electron-withdrawing substituent and a lactone skeleton (such as a 4-hydroxy-6-oxabicyclo[3.2.1$^{1,5}$] octane-7-one derivative or a 5-hydroxy-3-oxatricyclo[4.2.1.0$^{4,8}$] nonan-2-one derivative) and an unsaturated carboxylic acid represented by Formula (X2) below or its reactive derivative. Specific examples and preferred examples (ranges) of $R^h$, $R^1$, m, n, X, A, B in Formulas (X1) and (X2) are the same as described above.

[Chem. 10]

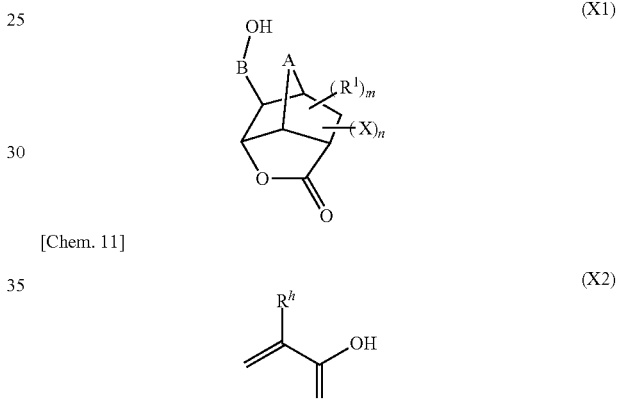

[Chem. 11]

Representative examples of the polycyclic alcohol, represented by Formula (X1), having an electron-withdrawing substituent and a lactone skeleton include compounds corresponding to compounds listed above as representative examples of the monomer represented by Formula (X) (compounds in which R is a hydrogen atom). Examples of the reactive derivative of the unsaturated carboxylic acid represented by Formula (X2) include acid halides, acid anhydrides, and esters.

More specifically, the monomer represented by Formula (X) can be obtained by (a) reacting a compound represented by Formula (X1) with an unsaturated carboxylic acid represented by Formula (X2) or its reactive derivative in a solvent, such as tetrahydrofuran, toluene, or methylene chloride, in the presence of a base, such as triethylamine, pyridine, or 4-dimethylaminopyridine as necessary; (b) reacting a compound represented by Formula (X1) with an unsaturated carboxylic acid represented by Formula (X2) or an esterified product of its reactive derivative in a similar solvent described above in the presence of an ester exchange catalyst, such as titanium isopropoxide; or (c) reacting a compound represented by Formula (X1) with an unsaturated carboxylic acid represented by Formula (X2) or its reactive derivative in a similar solvent described above in the presence of a strong acid, such as hydrochloric acid, sulfuric acid, or p-toluenesulfonic acid.

The reaction conditions in these methods are similar to those in common ester manufacturing methods. For example, in the method (a) described above, an amount of the active reactive derivative of the unsaturated carboxylic acid to be used is, for example, approximately from 1 to 1.5 mol per mol of the compound represented by Formula (X1); an amount of the base to be used is, for example, approximately from 1 to 3 mol (which may be a large excess amount) per mol of the active reactive derivative of the unsaturated carboxylic acid; and a reaction temperature is, for example, approximately from −20° C. to 50° C. In addition, in the method (b) described above, an amount of the unsaturated carboxylate to be used is, for example, approximately from 1 to 10 mol (which may be a large excess amount) per mol of the compound represented by Formula (X1); an amount of the ester exchange catalyst to be used is, for example, approximately from 0.0001 to 1 mol per mol of the compound represented by Formula (X1); and a reaction temperature is, for example, approximately from 0 to 150° C. Furthermore, in the method (c) described above, an amount of the unsaturated carboxylic acid to be used is, for example, approximately from 1 to 5 mol (which may be a large excess amount) per mol of the compound represented by Formula (X1); an amount of the strong acid to be used is, for example, approximately from 0.0001 to 1 mol per mol of the compound represented by Formula (X1); and a reaction temperature is, for example, approximately from 0 to 150° C. In addition, during these reactions, a polymerization inhibitor, such as hydroquinone monomethyl ether, or oxygen can be introduced to prevent polymerization.

The monomer represented by Formula (X) produced by the reaction can be separated and purified, for example, by a separation means, such as filtration, concentration, distillation, extraction, crystallization, recrystallization, or column chromatography; or by a combination of these means.

The polycyclic alcohol, represented by Formula (X1) above, having an electron-withdrawing substituent and a lactone skeleton can be obtained by subjecting an epoxy compound represented by Formula (X3) below (a cyclohexene oxide derivative or a 2,3-epoxybicyclo[2.2.1]heptane derivative) to a cyclization reaction.

[Chem. 12]

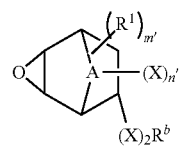

(X3)

X and $R^1$ in Formula (X3) are the same as described above. m' is from 0 to 8, preferably from 0 to 6, and more preferably from 0 to 3. n' is from 1 to 9, preferably from 1 to 5, and more preferably 1 or 2. $R^b$ is an organic group.

The organic group in $R^b$ is any group constituting a carboxylic ester, and examples include alkyl groups (especially $C_{1-6}$ alkyl groups), such as methyl, ethyl, propyl, isopropyl, butyl, and t-butyl groups; alkenyl groups (especially $C_{2-6}$ alkenyl groups), such as vinyl and allyl groups; cycloalkenyl groups, such as a cyclohexyl group; aryl groups, such as a phenyl group; and heterocyclic groups, such as a pyridyl group. The $R^b$ is particularly preferably a hydrogen atom, and in addition, preferably a $C_{1-4}$ alkyl group, such as a methyl or ethyl group.

When $R^b$ is a hydrogen atom, the cyclization reaction proceeds, for example, simply by dissolving the compound represented by Formula (X3) in a solvent. When $R^b$ is an organic group, once the compound represented by Formula (X3) is subjected to a commonly used hydrolysis reaction (such as an alkali hydrolysis reaction, acid hydrolysis reaction, or neutral hydrolysis) to produce a compound in which $R^b$ is a hydrogen atom, the cyclization reaction proceeds immediately and forms the compound represented by Formula (X1). The polycyclic alcohol, represented by Formula (X1) produced by the reaction, having an electron-withdrawing substituent and a lactone skeleton can be separated and purified, for example, by a separation means, such as filtration, concentration, distillation, extraction, crystallization, recrystallization, or column chromatography; or by a combination of these means.

Among the compounds represented by Formula (X1) above, a compound in which one or more fluorine atoms are attached to the ring can also be manufactured by subjecting a compound in which at least one hydrogen atom is attached to the ring to a commonly used fluorination reaction using a fluorinating agent, such as fluorine.

The epoxy compound represented by Formula (X3) above can be manufactured, for example, according to the reaction process formula below. In the formula, $R^{1a}$ is a substituent attached to a diene chain or a cyclopentadiene ring and represents: a halogen atom; an alkyl group that has from 1 to 6 carbons and may have a halogen atom; a hydroxyalkyl group that has from 1 to 6 carbons and may have a halogen atom and has a hydroxyl group moiety which may be protected by a protecting group; a carboxyl group that may form a salt; a substituted oxycarbonyl group; or an electron-withdrawing substituent. $R^{1b}$ is a substituent attached to a carbon atom constituting a carbon-carbon double bond and represents: a halogen atom; an alkyl group that has from 1 to 6 carbons and may have a halogen atom; a hydroxyalkyl group that has from 1 to 6 carbons and may have a halogen atom and has a hydroxyl group moiety which may be protected by a protecting group; a carboxyl group that may form a salt; a substituted oxycarbonyl group; or an electron-withdrawing substituent. i is the number of $R^{1a}$ and represents an integer from 0 to 6. j is the number of $R^{1b}$ and represents an integer from 0 to 3. At least one of i $R^{1a}$'s or j $R^{1b}$'s is an electron-withdrawing substituent. A and X are the same as described above. The meaning, specific examples, and preferred examples (ranges) of $R^1$, $R^b$, m, and n are the same as described above. In an embodiment of the present invention, at least one of j $R^{1b}$'s of Formula (X5) is preferably an electron-withdrawing substituent, and in particular, an electron-withdrawing substituent is preferably attached to the a position of the —$CO_2R^b$ group.

[Chem. 13]

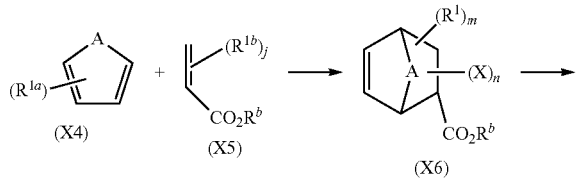

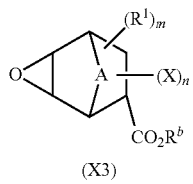

(X3)

That is, a diene compound, such as butadiene and a similar compound or a cyclopentadiene derivative, represented by Formula (X4) above and an unsaturated carboxylic acid represented by Formula (X5) above or its ester are subjected to a Diels-Alder reaction to form a cycloaddition product, such as a cyclohexene derivative or a bicyclo[2.2.1]heptane-2-ene derivative, represented by Formula (X6) above. This cycloaddition product is reacted with a peracid or a peroxide, and the epoxy compound represented by Formula (X3) (such as a cyclohexene oxide derivative or a 2,3-epoxybicyclo[2.2.1]heptane derivative) can be obtained. In some cases, such as when Rb is a hydrogen atom, a peracid or a peroxide is allowed to act on the compound represented by Formula (X6), and this cyclizes the compound immediately after epoxidation, and the compound represented by Formula (X1) may also be formed as the main product.

Representative examples of the diene compound, such as butadiene and a similar compound or a cyclopentadiene derivative, represented by Formula (X4) include butadiene, isoprene, 1,3-cyclopentadiene, 1-methyl-1,3-cyclopentadiene, 2-methyl-1,3-cyclopentadiene, 5-methyl-1,3-cyclopentadiene, 1,2-dimethyl-1,3-cyclopentadiene, 1,4-dimethyl-1,3-cyclopentadiene, 2,3-dimethyl-1,3-cyclopentadiene, 1,2,3,4-tetramethyl-1,3-cyclopentadiene, 1,2,3,4,5-pentamethyl-1,3-cyclopentadiene, 1-hydroxymethyl-1,3-pentadiene, 1,4-bis(hydroxymethyl)-1,3-cyclopentadiene, 2,3-bis(hydroxymethyl)-1,3-cyclopentadiene, 1-acetoxymethyl-1,3-cyclopentadiene, 1,4-bis(acetoxymethyl)-1,3-cyclopentadiene, and 2,3-bis(acetoxymethyl)-1,3-cyclopentadiene. In addition, representative examples of the diene compound represented by Formula (X4) where A is an oxygen atom or a sulfur atom include furan, 2-methylfuran, 3-methylfuran, 2,3-dimethylfuran, thiophene, 2-methylthiophene, 3-methylthiophene, and 2,3-dimethylthiophene.

The reaction of the compound represented by Formula (X4) with the compound represented by Formula (X5) is carried out in the presence or absence of a solvent. Examples of the solvent include: esters, such as ethyl acetate; organic acids, such as acetic acid; alcohols, such as t-butyl alcohol; halogenated hydrocarbons, such as chloroform, dichloromethane, and 1,2-dichloroethane; aromatic hydrocarbons, such as benzene and toluene; aliphatic hydrocarbons, such as hexane, heptane, and octane; alicyclic hydrocarbons, such as cyclohexane; amides, such as N,N-dimethylformamide and N,N-dimethylacetamide; nitriles, such as acetonitrile, propionitrile, and benzonitrile; and chain or cyclic ethers, such as ethyl ether and tetrahydrofuran. These solvents are used alone or in a mixture of two or more.

A Lewis acid may be added into the system to improve the reaction rate and selectivity (such as stereoselectivity) of the reaction. Examples of the Lewis acid include, but are not limited to, $AlCl_3$, $SnCl_4$, $TiCl_4$, $BF_3$, and $ZnI_2$. A reaction temperature can be appropriately selected according to the type of reaction raw material or the like but is, for example, from −80° C. to 300° C. and more preferably from −70° C. to 250° C. The reaction is carried out under normal pressure or increased pressure. The reaction may be carried out by any method, such as a batch method, a semi-batch method, or a continuous method. The compound represented by Formula (X6) produced can be separated and purified, for example, by a separation means, such as filtration, concentration, distillation, extraction, crystallization, recrystallization, or column chromatography; or by a combination of these means.

Among the peracids or peroxides to be reacted with the compound represented by Formula (X6), examples of the peracid include organic peracids, such as performic acid, peracetic acid, trifluoroperacetic acid, perbenzoic acid, m-chloroperbenzoic acid, and monoperoxyphthalic acid; and inorganic peracids, such as permanganic acid. The peracid can also be used in the form of a salt. The organic peracid may be an equilibrium peracid (e.g., such as equilibrium performic acid or equilibrium peracetic acid). That is, for example, an organic acid, such as formic acid or acetic acid, and hydrogen peroxide may be used in combination to produce the corresponding organic peracid in the system. When an equilibrium peracid is used, a small amount of strong acid, such as sulfuric acid, may be added as a catalyst. The amount of the peracid to be used is, for example, approximately from 0.8 to 2 mol, preferably approximately from 0.9 to 1.5 mol, and more preferably approximately from 0.95 to 1.2 mol per mol of the compound represented by Formula (X6).

Examples of the peroxide to be reacted with the compound represented by Formula (X6) include hydrogen peroxide, peroxides, hydroperoxides, peroxoacids, and salts of peroxoacids. For the hydrogen peroxide, pure hydrogen peroxide may be used, but from the viewpoint of handling, the hydrogen peroxide is commonly used in a diluted form in an appropriate solvent, for example, water (e.g., 30 wt. % hydrogen peroxide water). An amount of the peroxide, such as hydrogen peroxide, to be used is, for example, approximately from 0.9 to 5 mol, preferably approximately from 0.9 to 3 mol, and more preferably approximately from 0.95 to 2 mol per mol of the compound represented by Formula (X6).

Hydrogen peroxide is often used with a metal compound. Examples of the metal compound include compounds containing a metal element, such as W, Mo, V, Mn, or Re, the compounds, such as oxides, oxoacids or their salts, sulfides, halides, oxyhalides, borides, carbides, silicides, nitrides, phosphides, peroxides, complexes (inorganic complexes and organic complexes), and organometallic compounds. These metal compounds can be used alone or in combination of two or more.

Examples of the oxide include tungsten oxides (such as $WO_2$ and $WO_3$), molybdenum oxides (such as $MoO_2$ and $MoO_3$), vanadium oxides (such as VO, $V_2O_3$, $VO_2$, and $V_2O_5$), manganese oxides (such as MnO, $Mn_2O_3$, $Mn_3O_4$, $MnO_2$, and $Mn_2O_7$), and composite oxides containing a metal element, such as W, Mo, V, or Mn.

The oxoacid includes tungstic acid, molybdic acid, vanadic acid, manganic acid, and the like, as well as isopolyacids, such as isopolytungstic acid, isopolymolybdic acid, and isopolyvanadic acid; heteropolyacids composed of the metal element described above and another metal or the like, such as phosphotungstic acid, silicotungstic acid, phosphomolybdic acid, silicomolybdic acid, and phosphovanadomolybdic acid. Another metal element or the like in the heteropolyacid is preferably phosphorus or silicon and particularly phosphorus.

Examples of the salt of the oxoacid include alkali metal salts of the oxoacids, such as sodium salts and potassium salts; alkaline earth metal salts of the oxoacids, such as magnesium salts, calcium salts, and barium salts; ammonium salts of the oxoacids; and transition metal salts of the oxoacids. The salt of the oxoacid (e.g., a salt of a heteropolyacid) may be a salt in which some of the hydrogen atoms corresponding to the cations are replaced by other cations.

Examples of the peroxide containing a metal element include peroxoacids (such as peroxotungstic acid, peroxomolybdic acid, and peroxovanadic acid), salts of peroxoacids (such as alkali metal salts of the peroxoacids, alkaline earth metal salts of the peroxoacids, ammonium salts of the peroxoacids, transition metal salts of the peroxides), peracids (such as permanganic acid), and salts of peracids (such as alkali metal salts of the peracids, alkaline earth metal salts of the peracids, ammonium salts of the peracids, and transition metal salts of the peracids).

An amount of the metal compound to be used together with hydrogen peroxide is, for example, approximately from 0.0001 to 2 mol, preferably approximately from 0.0005 to 0.5 mol, and more preferably approximately from 0.001 to 0.2 mol per mol of the compound represented by Formula (X6).

The reaction of the compound represented by Formula (X6) with the peracid or peroxide is carried out in the presence or absence of a solvent. Examples of the solvent include alcohols, such as t-butyl alcohol; halogenated hydrocarbons, such as chloroform, dichloromethane, and 1,2-dichloroethane; aromatic hydrocarbons, such as benzene; aliphatic hydrocarbons, such as hexane, heptane, and octane; alicyclic hydrocarbons, such as cyclohexane; amides, such as N,N-dimethylformamide and N,N-dimethylacetamide; nitriles, such as acetonitrile, propionitrile, and benzonitrile; chain or cyclic ethers, such as ethyl ether and tetrahydrofuran; esters, such as ethyl acetate; organic acids, such as acetic acid; and water. These solvents are each used alone or in a mixture of two or more. When the reaction is carried out in a heterogeneous system, water or a solvent containing water is often used as the solvent.

The reaction temperature can be appropriately selected in view of the reaction rate and reaction selectivity but is preferably from-10 to 100° C. and more preferably from 0 to 80° C. The reaction may be carried out by any method, such as a batch method, a semi-batch method, or a continuous method.

The double bond of the compound represented by Formula (X6) is epoxidized by the above reaction to produce the epoxy compound represented by Formula (X3). For example, in some cases, such as when Rb is a hydrogen atom, subsequently an intramolecular cyclization reaction accompanied by ring opening of the epoxy ring can proceed to produce the polycyclic alcohol containing an electron-withdrawing substituent and a lactone skeleton represented by Formula (X1).

The epoxy compound represented by Formula (X3) produced by the reaction and the compound represented by Formula (X1) can be separated and purified, for example, by a separation means, such as filtration, concentration, distillation, extraction, crystallization, recrystallization, or column chromatography; or by a combination of these means.

A compound in which one or more fluorine atoms are attached to the ring shown in Formula (X) can be produced by subjecting a compound in which a hydrogen atom is attached to the ring shown in Formula (X) to a commonly used fluorination reaction using a fluorinating agent, such as fluorine.

The polycyclic ester containing an electron-withdrawing substituent and a lactone skeleton according to an embodiment of the present invention can be used as a raw material for functional polymers, such as paints and photoresists, a raw material for pharmaceuticals, agricultural chemicals, other fine chemicals, and the like.

Resin

A resin according to an embodiment of the present invention contains a polymerization unit corresponding to the monomer represented by Formula (X) above, that is, a polymerization unit represented by Formula (Y) below. Thus, the resin exhibits high heat resistance. Thus, the resin is, for example, preferably used as a resin for a photoresist.

[Chem. 14]

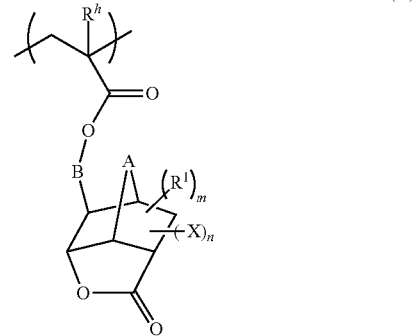

(Y)

In Formula (Y), $R^h$, $R^1$, A, B, n, and m are the same as those described for Formula (X). That is, $R^h$ represents a halogen atom or an alkyl group having from 1 to 6 carbons and having a halogen atom. $R^1$ is a substituent attached to a ring and represents a halogen atom, an alkyl group that has from 1 to 6 carbons and may have a halogen atom, a hydroxyalkyl group that has from 1 to 6 carbons and may have a halogen atom and has a hydroxyl group moiety which may be protected by a protecting group, a carboxyl group that may form a salt, or a substituted oxycarbonyl group. A represents an alkylene group having from 1 to 6 carbons, an oxygen atom, a sulfur atom, or no bond. m is the number of $R^1$ and represents an integer from 0 to 8. X represents an electron-withdrawing substituent; n is the number of X attached to a ring and represents an integer from 1 to 9. B represents a single bond or a linking group. A steric position of a COOB-group attached to a polymer chain may be either endo or exo.

The resin according to an embodiment of the present invention may have a group (sometimes referred to as an "acid degradable group") which undergoes elimination of a portion thereof by the action of an acid to form a polar group. As a result, the resin according to an embodiment of the present invention increases its polarity due to the action of the acid, and the solubility in an alkaline developing solution increases.

Examples of the polar group include phenolic a hydroxyl group, a carboxy group, a fluorinated alcohol group (preferably a hexafluoroisopropanol group), a sulfonic acid group, a sulfonamide group, a sulfonylimide group, a (alkylsulfonyl) (alkylcarbonyl)methylene group, an (alkylsulfonyl) (alkylcarbonyl) imide group; a bis(alkylcarbonyl)methylene group, a bis(alkylcarbonyl) imide group, a bis(alkylsulfonyl)methylene group, a bis(alkylsulfonyl) imide group, a tris (alkylcarbonyl)methylene group, a tris (alkylsulfonyl)methylene group, and other such acidic groups, and alcoholic hydroxyl groups. Among them, carboxy groups, fluorinated alcohol groups (preferably a hexafluoroisopropanol group), and sulfonate groups are preferred.

The acid-degradable group is preferably a group in which a hydrogen atom of the polar group is replaced by a group to be eliminated by an acid. Examples of the acid-degradable group include —C($R^I$)($R^{II}$)($R^{III}$) and —C($R^{IV}$)($R^V$)(O$R^{VI}$). In the formula, $R^I$ to $R^{III}$, and $R^{VI}$ each independently represent an alkyl group, a cycloalkyl group, an aryl group, an aralkyl group, or an alkenyl group. $R^{IV}$ and $R^V$ each independently represent a hydrogen atom, an alkyl group, a cycloalkyl group, an aryl group, an aralkyl group, or an alkenyl group. At least two groups of $R^I$ to $R^{III}$ may be bonded to each other to form a ring. In addition, $R^{IV}$ and $R^V$ may be bonded to each other to form a ring.

The number of carbon atoms in the acid-degradable group is not particularly limited, but is preferably 4 or greater, and more preferably 5 or greater. The upper limit of the number of carbon atoms is not particularly limited, but is preferably 20.

The alkyl group of the $R^I$ to $R^{VI}$ is preferably an alkyl group having from 1 to 8 carbons, and examples include a methyl group, an ethyl group, a propyl group, a n-butyl group, a s-butyl group, a t-butyl group, a hexyl group, and an octyl group.

The cycloalkyl group of the $R^I$ to $R^{VI}$ may be a monocyclic hydrocarbon group or a polycyclic (bridged cyclic) hydrocarbon group. The monocyclic hydrocarbon group is preferably a cycloalkyl group having from 3 to 8 carbons, and examples include a cyclopropyl group, a cyclobutyl group, a cyclopentyl group, a cyclohexyl group, and a cyclooctyl group. The polycyclic hydrocarbon group is preferably a cycloalkyl group having from 6 to 20 carbons, and examples include an adamantyl group, a norbornyl group, an isoboronyl group, a camphanyl group, a dicyclopentyl group, an α-pinel group, a tricyclodecanyl group, a tetracyclododecyl group, and an androstanyl group. At least one carbon atom in the cycloalkyl group may be replaced by a hetero atom, such as an oxygen atom.

The aryl group of the $R^I$ to $R^{VI}$ is preferably an aryl group having from 6 to 14 carbons, and examples include a phenyl group, a naphthyl group, and an anthryl group.

The aralkyl group of the $R^I$ to $R^{VI}$ is preferably an aralkyl group having from 7 to 12 carbons, and examples include a benzyl group, a phenethyl group, and a naphthylmethyl group.

The alkenyl group of the $R^I$ to $R^{VI}$ is preferably an alkenyl group having from 2 to 8 carbons, and examples include a vinyl group, an allyl group, a butenyl group, and a cyclohexenyl group.

The ring formed by the bonding of at least two groups of the $R^I$ to $R^{III}$ to each other and the ring formed by the bonding of $R^{IV}$ and $R^V$ are preferably a cycloalkane ring. Examples of the cycloalkane ring include monocyclic cycloalkane rings, such as a cyclopropane ring, a cyclobutane ring, a cyclopentane ring, and a cyclohexane ring; and polycyclic cycloalkane rings, such as a norbornane ring, a tricyclodecane ring, a tetracyclododecane ring, and an adamantane ring.

The alkyl group, the cycloalkyl group, the aryl group, the aralkyl group, the alkenyl group, and the cycloalkane ring in $R^I$ to $R^{VI}$ may each have a substituent.

The acid-degradable group is preferably, among others, a t-butyl group, t-amyl group, and groups represented by Formulas (I) to (IV) below.

[Chem. 15]

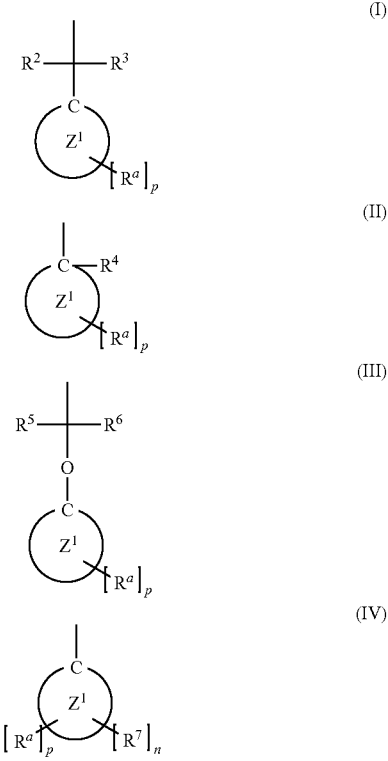

$R^2$ to $R^7$, $R^a$, n, p, and a ring $Z^1$ in Formulas (I) to (IV) above respectively represent the same as $R^2$ to $R^7$, $R^a$, n, p, and a ring $Z^1$ in Formulas (a1) to (a4) described later.

The acid-degradable group may be provided via a spacer. The spacer is the same as a linking group exemplified and described as A in Formula (1) described later.

The resin according to an embodiment of the present invention preferably contains an acid-degradable group as a polymerization unit having an acid-degradable group. Examples of such a polymerization unit having an acid-degradable group include a polymerization unit represented by Formula (1) below.

[Chem. 16]

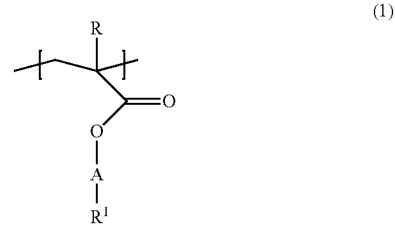

In Formula (1) above, $R^1$ represents the acid-degradable group. In Formula (1) above, R represents a hydrogen atom, a halogen atom, or an alkyl group that has from 1 to 6 carbons and may have a halogen atom. Examples of the halogen atom include a chlorine atom, a bromine atom, and an iodine atom. Examples of the alkyl group having from 1 to 6 carbons include a methyl group, an ethyl group, a propyl group, an isopropyl group, a n-butyl group, an iso-butyl group, a s-butyl group, a t-butyl group, a pentyl group, an isoamyl group, a s-amyl group, a t-amyl group, a hexyl group. Examples of the alkyl group having from 1 to 6 carbons and having a halogen atom include groups (halo ($C_{1-6}$) alkyl groups) in which one or two or more of hydrogen atoms constituting the alkyl group are replaced by halogen atoms, such as trifluoromethyl and 2,2,2-trifluoro-ethyl groups.

In Formula (1) above, A represents a single bond or a linking group. Examples of the linking group include a carbonyl group (—C(=O)—), an ether bond (—O—), an ester bond (—C(=O)—O—), an amide bond (—C(=O)—NH—), a carbonate bond (—O—C(=O)—O—), a group in which a plurality of these groups are linked, and a group in which an alkylene group and these groups are bonded. Examples of the alkylene group include linear or branched alkylene groups, such as a methylene group, a methylmethylene group, a dimethylmethylene group, an ethylene group, a propylene group, and a trimethylene group; and divalent alicyclic hydrocarbon groups (in particular, divalent cycloalkylene groups), such as a 1,2-cyclopentylene group, a 1,3-cyclopentylene group, a cyclopentylidene group, a 1,2-cyclohexylene group, a 1,3-cyclohexylene group, a 1,4-cyclohexylene group, and a cyclohexylidene group.

Among the polymerization units represented by Formula (1) above, the resin according to an embodiment of the present invention preferably includes at least one type of polymerization unit selected from the group consisting of polymerization units represented by Formulas (a1) to (a4). Note that the "at least one type of polymerization unit selected from the group consisting of polymerization units represented by Formulas (a1) to (a4)" may be referred to as a "monomer unit a".

[Chem. 17]

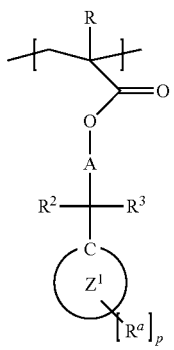
(a1)

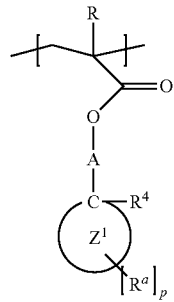
(a2)

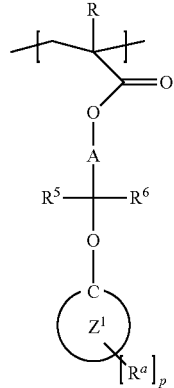
(a3)

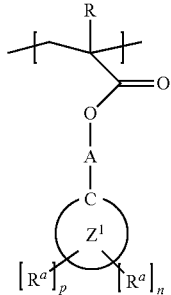
(a4)

In the polymerization units represented by Formulas (a1) to (a4) above, similarly to R in Formula (1) above, R represents a hydrogen atom, a halogen atom, or an alkyl group that has from 1 to 6 carbons and may have a halogen atom; and A represents a single bond or a linking group. A in Formulas (a1) to (a4) above is preferably, among others, a single bond, and a group in which an alkylene group and a carbonyloxy group are bonded (alkylene-carbonyloxy group). $R^2$ to $R^4$ are identical or different and represent an alkyl group that has from 1 to 6 carbons and may have a substituent. $R^2$ and $R^3$ may be bonded to each other to form a ring. $R^5$ and $R^6$ are identical or different and represent a hydrogen atom or an alkyl group that has from 1 to 6 carbons and may have a substituent. $R^7$ represents a —$COOR^c$ group, and the $R^e$ represents a tertiary hydrocarbon group that may have a substituent, a tetrahydrofuranyl group, a tetrahydropyranyl group, or an oxepanyl group. n represents an integer from 1 to 3. When n is 2 or 3, $R^7$'s may each be identical or different. $R^a$ is a substituent attached to a ring $Z^1$, the substituents being identical or different, and represents an oxo group, an alkyl group, a hydroxy group that may be protected by a protecting group, a hydroxyalkyl group that may be protected by a protecting group, or a carboxy group that may be protected by a protecting group. p represents an integer from 0 to 3. The ring $Z^1$ represents an alicyclic hydrocarbon ring having from 3 to 20 carbons. When p is 2 or 3, $R^a$'s may each be identical or different.

Examples of the alkyl group in the $R^a$ include alkyl groups having from 1 to 6 carbons, such as methyl, ethyl, propyl, isopropyl, n-butyl, s-butyl, t-butyl, pentyl, isoamyl, s-amyl, t-amyl, and n-hexyl groups.

Examples of the hydroxyalkyl group in the $R^a$ include hydroxy $C_{1-6}$ alkyl groups, such as hydroxymethyl, 2-hydroxyethyl, 1-hydroxyethyl, 3-hydroxypropyl, 2-hydroxypropyl, 4-hydroxybutyl, and 6-hydroxyhexyl groups.

Examples of the protecting group that the hydroxy group and the hydroxyalkyl group in the $R^a$ may have include: $C_{1-4}$ alkyl groups, such as methyl, ethyl, and t-butyl groups; a group that forms an acetal bond together with the oxygen atom constituting the hydroxy group (e.g., $C_{1-4}$ alkyl-O—$C_{1-4}$ alkyl groups, such as a methoxymethyl group); a group that forms an ester bond together with the oxygen atom constituting the hydroxy group (e.g., such as an acetyl group and a benzoyl group).

Examples of the protecting group for the carboxy group in the $R^a$ include: $C_{1-6}$ alkyl groups, such as methyl, ethyl, propyl, isopropyl, n-butyl, s-butyl, t-butyl, pentyl, isoamyl, s-amyl, t-amyl, and hexyl groups; a 2-tetrahydrofuranyl group; a 2-tetrahydropyranyl group; and a 2-oxepanyl group.

Examples of the alkyl group having from 1 to 6 carbons in the $R^2$ to $R^6$ include linear or branched alkyl groups, such as methyl, ethyl, propyl, isopropyl, n-butyl, iso-butyl, s-butyl, t-butyl, pentyl, isoamyl, s-amyl, t-amyl, and hexyl groups. Among these, a $C_{1-4}$ alkyl group is preferred, a $C_{1-3}$ alkyl group is more preferred, and a $C_{1-2}$ alkyl group is even more preferred.

Examples of the substituent that the alkyl group having from 1 to 6 carbons in the $R^2$ to $R^6$ may have include a halogen atom, a hydroxy group, substituted hydroxy groups (e.g., such as $C_{1-4}$ alkoxy groups, such as methoxy, ethoxy, and propoxy groups), and a cyano group. Examples of the alkyl group having from 1 to 6 carbons and having a substituent include: halo ($C_{1-6}$) alkyl groups in which one or two or more of hydrogen atoms constituting the alkyl group are replaced by halogen atoms, such as a trifluoromethyl group and a 2,2,2-trifluoroethyl group; hydroxymethyl, 2-hydroxyethyl, methoxymethyl, 2-methoxyethyl, ethoxymethyl, 2-ethoxyethyl, cyanomethyl, and 2-cyanoethyl groups.

When $R^2$ and $R^3$ are bonded to each other to form a ring, examples of the ring include alicyclic hydrocarbon rings that have from 3 to 12 carbons and may have a substituent.

Examples of the tertiary hydrocarbon group in the $R^e$ include a t-butyl group and a t-amyl group.

Examples of the substituent that the tertiary hydrocarbon group in the $R^c$ may have include a halogen atom, a hydroxy group, substituted hydroxy groups (e.g., such as $C_{1-4}$ alkoxy groups, such as methoxy, ethoxy, and propoxy groups), and a cyano group.

Examples of the alicyclic hydrocarbon ring having from 3 to 20 carbons in the ring $Z^1$ include: monocyclic alicyclic hydrocarbon rings, including approximately 3- to 20-membered (preferably 3- to 15-membered and particularly preferably 5- to 12-membered) cycloalkane rings, such as a cyclopropane ring, a cyclobutane ring, a cyclopentane ring, a cyclohexane ring, and a cyclooctane ring, and approximately 3- to 20-membered (preferably 3- to 15-membered and particularly preferably 5- to 10-membered) cycloalkene rings, such as a cyclopropene ring, a cyclobutene ring, a cyclopentene ring, and a cyclohexene ring; an adamantane ring; rings containing a norbornane ring or a norbornene ring, such as a norbornane ring, a norbornene ring, a bornane ring, an isobornane ring, a tricyclo[5.2.1.0$^{2,6}$]decane ring, and a tetracyclo [4.4.0.1$^{2,5}$.1$^{7,10}$] dodecane ring; a ring in which a polycyclic aromatic fused ring is hydrogenated (preferably a fully hydrogenated ring), such as a perhydroindene ring, a decalin ring (perhydronaphthalene ring), a perhydrofluorene ring (tricyclo[7.4.0.0$^{3,8}$] tridecane ring), and a perhydroanthracene ring; and approximately from bicyclic to hexacyclic bridged hydrocarbon rings, such as bridged hydrocarbon rings of a bicyclic system, tricyclic system, tetracyclic system, etc. (e.g., bridged hydrocarbon rings having approximately from 6 to 20 carbons), such as a tricyclo[4.2.2.1$^{2,5}$]undecane ring.

Specific examples of the monomer unit a include monomer units represented by the formulas below. In the monomer units represented by the formulas below, Rd represents a methyl group or a hydrogen atom, and $R^e$ represents a methyl group or a hydrogen atom. In addition, the attaching position of $R^e$ to the alicyclic hydrocarbon ring is not particularly limited, and one or a plurality of $R^e$'s may be attached to any carbon atom of the carbon atoms constituting the alicyclic hydrocarbon ring. When a monomer unit represented by the formulas below contains two or more $R^e$'s, the two or more $R^e$'s may each be identical or different. The monomer unit a can be introduced into the resin by polymerizing the corresponding unsaturated carboxylate.

[Chem. 18]

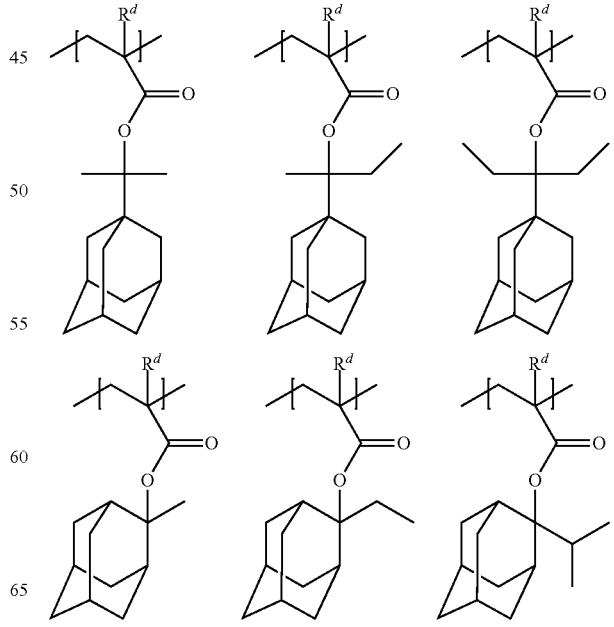

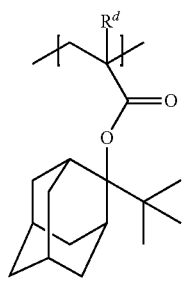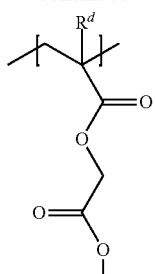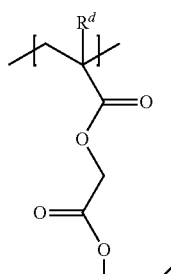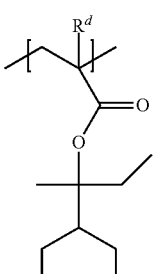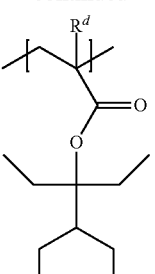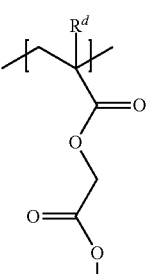
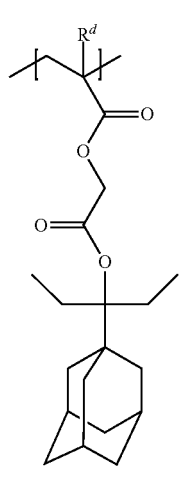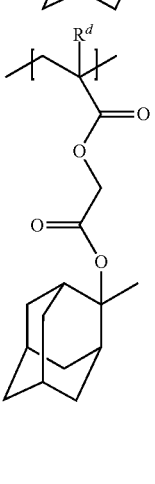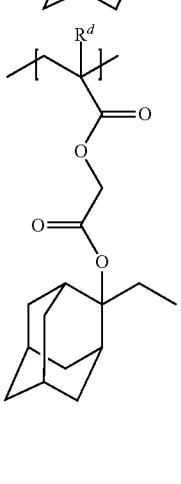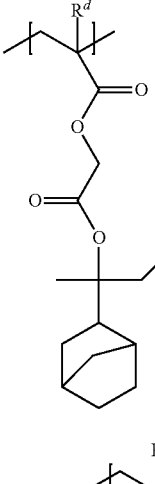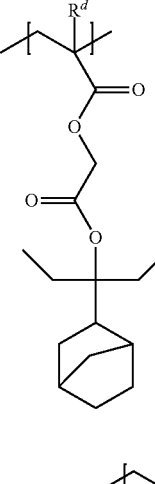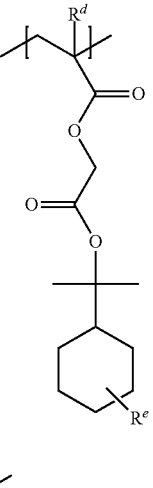
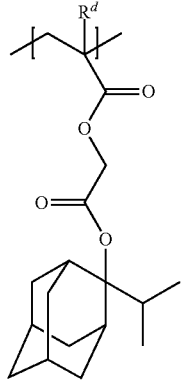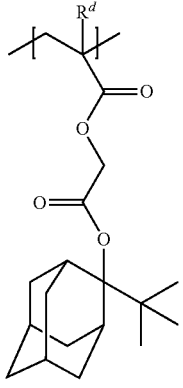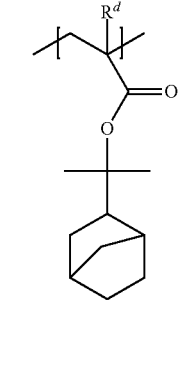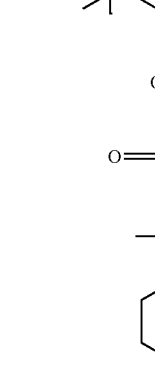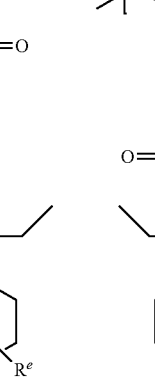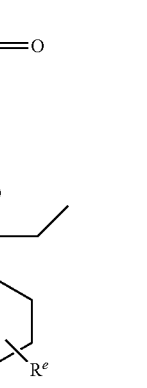
[Chem. 19]
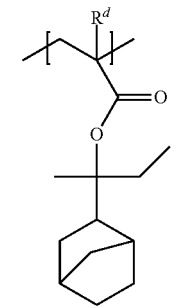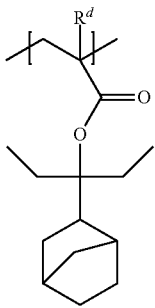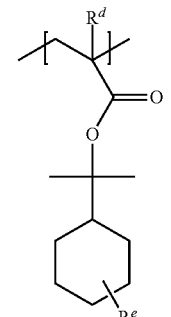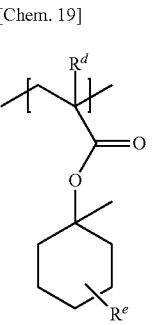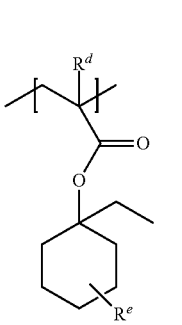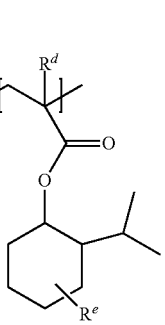

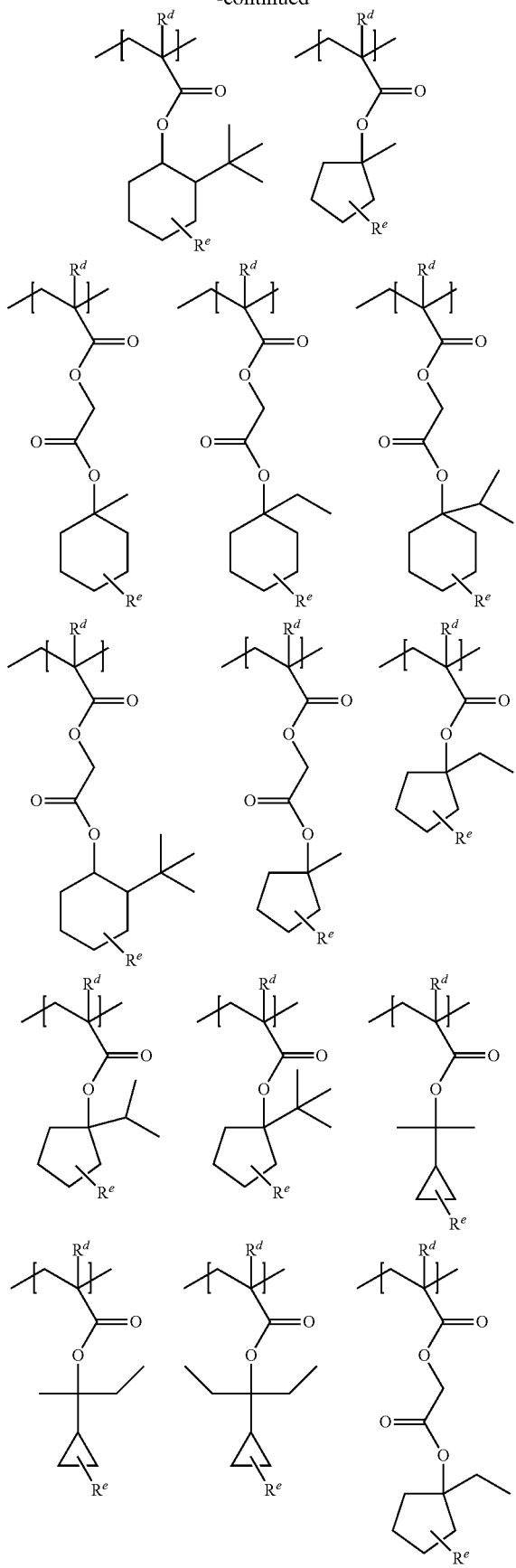
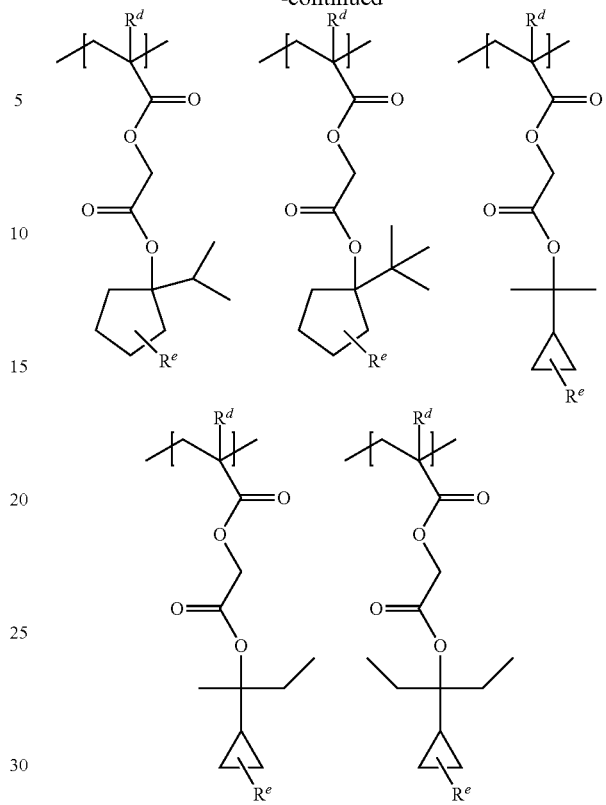

For the polymerization unit represented by Formula (1) above, in addition to the polymerization unit represented by the monomer unit a, other polymerization units can be used, such as polymerization units (excluding, however, polymerization units corresponding to a monomer unit b described later) that correspond to an unsaturated carboxylate containing a lactone ring in which the oxygen atom constituting the ester bond is attached to the β position of the lactone ring and the lactone ring has at least one hydrogen atom at the α position.

The polymerization unit represented by Formula (1) may contain only one type or a combination of two or more types of polymerization units. The polymerization unit represented by Formula (1) above preferably contains at least one type of polymerization unit selected from the group consisting of polymerization units represented by Formulas (a1) to (a4). In addition, for the polymerization unit represented by Formula (1) above, the following units may be used in combination: at least one type of polymerization unit selected from the group consisting of polymerization units represented by Formulas (a1) to (a4) above, and a polymerization unit represented by Formula (1) above (another polymerization unit represented by Formula (1)) other than the at least one type of polymerization unit selected from the group consisting of polymerization units represented by Formulas (a1) to (a4) above. The another polymerization unit represented by Formula (1) is preferably a polymerization unit represented by Formula (1) in which $R^1$ is a group having a tertiary hydrocarbon group (e.g., such as a t-butyl group and a t-amyl group).

In addition, the resin according to an embodiment of the present invention preferably contains an alicyclic skeleton having at least [—C(=O)—O—], [—S(=O)$_2$—O—], or [—C(=O)—O—C(=O)—]. Inclusion of the alicyclic skeleton in the resin can impart a higher substrate adhesion and etching resistance to the resin. The resin according to an embodiment of the present invention preferably contains the alicyclic skeleton as the polymerization unit having the alicyclic skeleton. The polymerization unit containing the alicyclic skeleton having at least [—C(=O)—O—], [—S (=O)$_2$—O—], or [—C(=O)—O—C(=O)—] described above may be referred to as the "monomer unit b". The monomer unit b does not include a unit corresponding to the polymerization unit represented by Formula (Y).

Of the monomer units b, the resin according to an embodiment of the present invention preferably includes at least one type of polymerization unit selected from the group consisting of polymerization units represented by Formulas (b1) to (b5) below (except for those corresponding to the polymerization units represented by Formula (Y)). In Formulas (b1) to (b5) below, R represents a hydrogen atom, a halogen atom, or an alkyl group that has from 1 to 6 carbons and may have a halogen atom; and A represents a single bond or a linking group. X represents no bond, a methylene group, an ethylene group, an oxygen atom, or a sulfur atom. Y represents a methylene group or a carbonyl group. Z represents a divalent organic group (e.g., such as an alkylene group exemplified and described as an alkylene group that may be contained in A in the polymerization units represented by Formulas (a1) to (a4) (especially a linear alkylene group having from 1 to 3 carbons)). $V^1$ to $V^3$ are identical or different and represent —CH$_2$—, [—C(=O)—], or [—C (=O)—O—] with the proviso that at least one of $V^1$ to $V^3$ is [—C(=O)—O—]. $R^8$ to $R^{14}$ are identical or different and represent a hydrogen atom, a fluorine atom, an alkyl group that may have a fluorine atom, a hydroxy group that may be protected by a protecting group, a hydroxyalkyl group that may be protected by a protecting group, a carboxy group that may be protected by a protecting group, or a cyano group.

[Chem. 20]

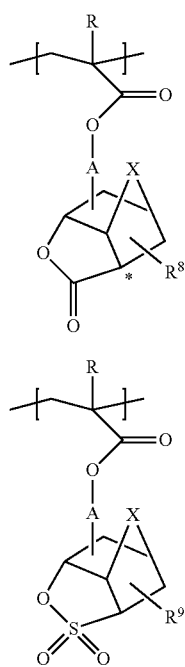

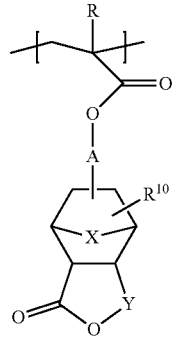

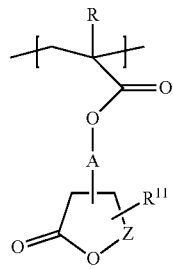

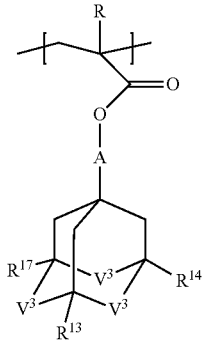

Examples of R and A in the polymerization units represented by Formulas (b1) to (b5) include examples similar to those for R and A in the polymerization units represented by Formulas (a1) to (a4). In addition, for the groups in $R^8$ to $R^{14}$ in the polymerization units represented by Formulas (b1) to (b5), examples of the alkyl group, hydroxy group that may be protected by a protecting group, hydroxyalkyl group that may be protected by a protecting group, and carboxy group that may be protected by a protecting group include examples similar to those for the groups in $R^a$ in the polymerization units represented by Formulas (a1) to (a4).

Examples of the alkyl group having a fluorine atom in the $R^8$ to $R^{14}$ include groups [fluoro (C$_{1-6}$) alkyl groups] in which one or two or more of the hydrogen atoms constituting the alkyl group are replaced by fluorine atoms, such as trifluoromethyl and 2,2,2-trifluoroethyl groups.

The polymerization units represented by Formulas (b1) to (b4) above may have one or two or more each of the $R^8$'s to $R^{11}$'s and preferably has from one to three each of the $R^8$'s to $R^{11}$'s. In addition, when the polymerization units represented by Formulas (b1) to (b4) include two or more of the $R^8$'s to $R^{11}$'s, the two or more $R^8$'s to $R^{11}$'s may each be identical or different.

Preferable polymerization units among the monomer units b are a polymerization unit represented by Formula (b1) and $R^8$ is an electron-withdrawing substituent, such as a cyano group, a group having an amide group, a group having an imide group, or a fluoro ($C_{1-6}$) alkyl group; a polymerization unit represented by Formula (b2); a polymerization unit represented by Formula (b3) and Y is a carbonyl group; a polymerization unit represented by Formula (b4); and a polymerization unit represented by Formula (b5). These polymerization units are preferable from the viewpoints of its ability to impart excellent substrate adhesion and etching resistance to the resin, to provide excellent solubility in an alkaline developing solution, and to form fine patterns with high precision.

In Formula (b1) above, when $R^8$ is an electron-withdrawing substituent, such as a cyano group, a group having an amide group, a group having an imide group, or a fluoro ($C_{1-6}$) alkyl group, the $R^8$ is particularly preferably at least attached to a carbon atom marked by * in Formula (b1).

Specific examples of the monomer unit b include polymerization units represented by the formulas below. In the monomer units represented by the formulas below, Rd represents a methyl group or a hydrogen atom. The monomer unit b can be introduced into the resin by polymerizing the corresponding unsaturated carboxylate.

[Chem. 21]

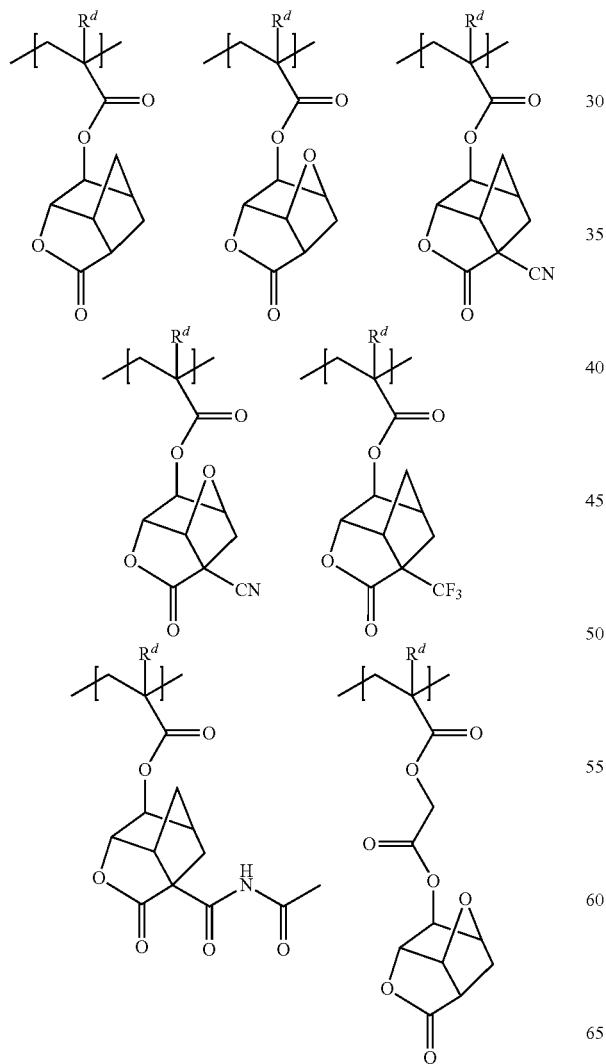

-continued

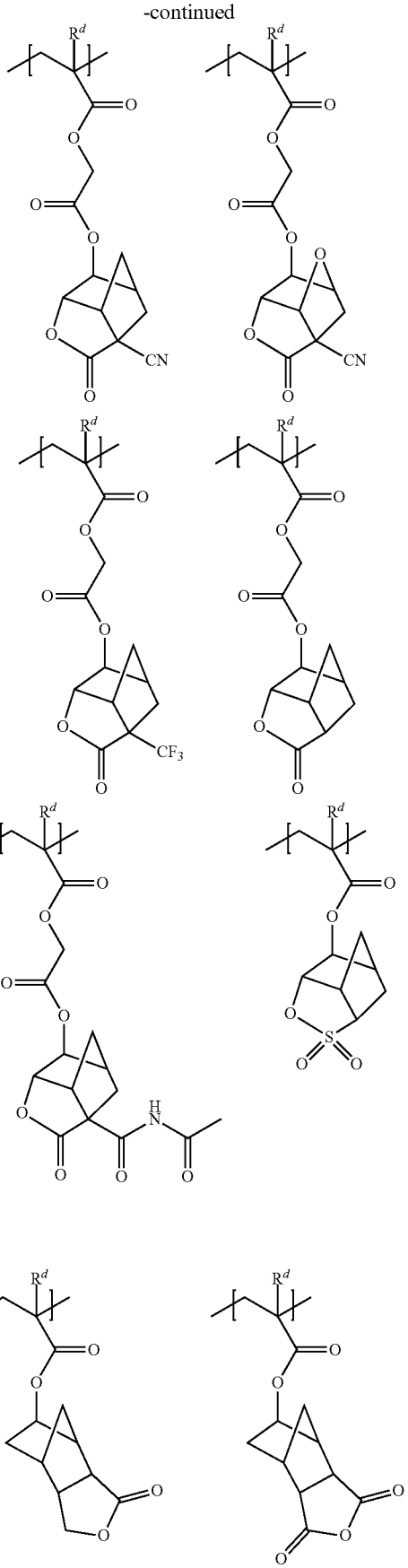

-continued

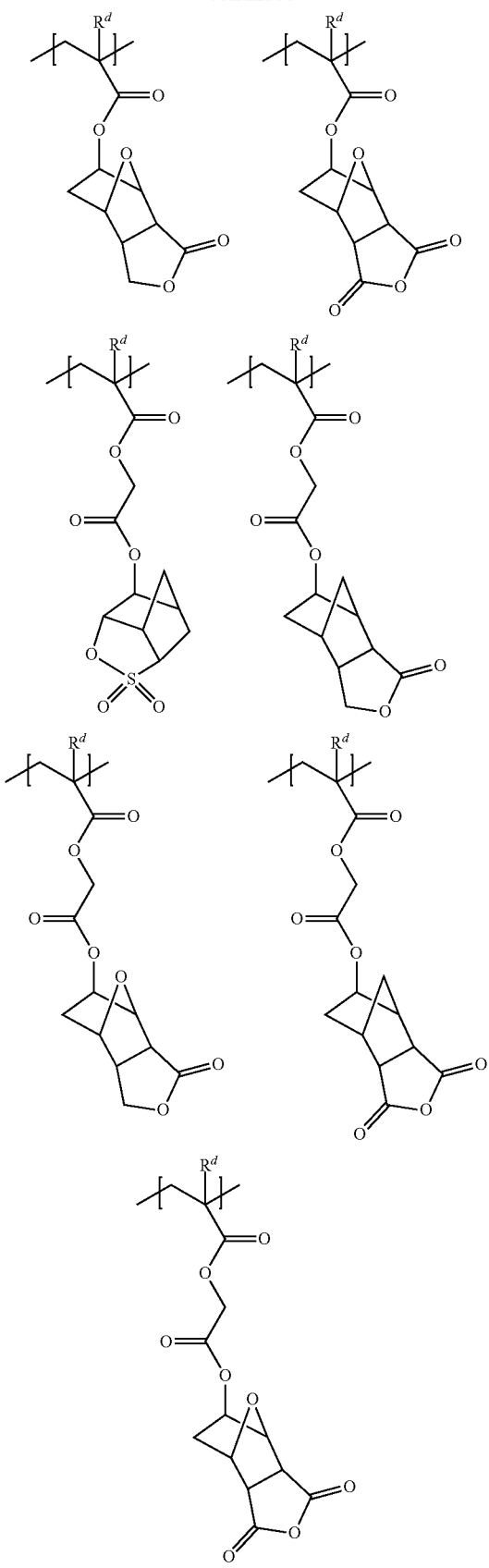

-continued

[Chem. 22]

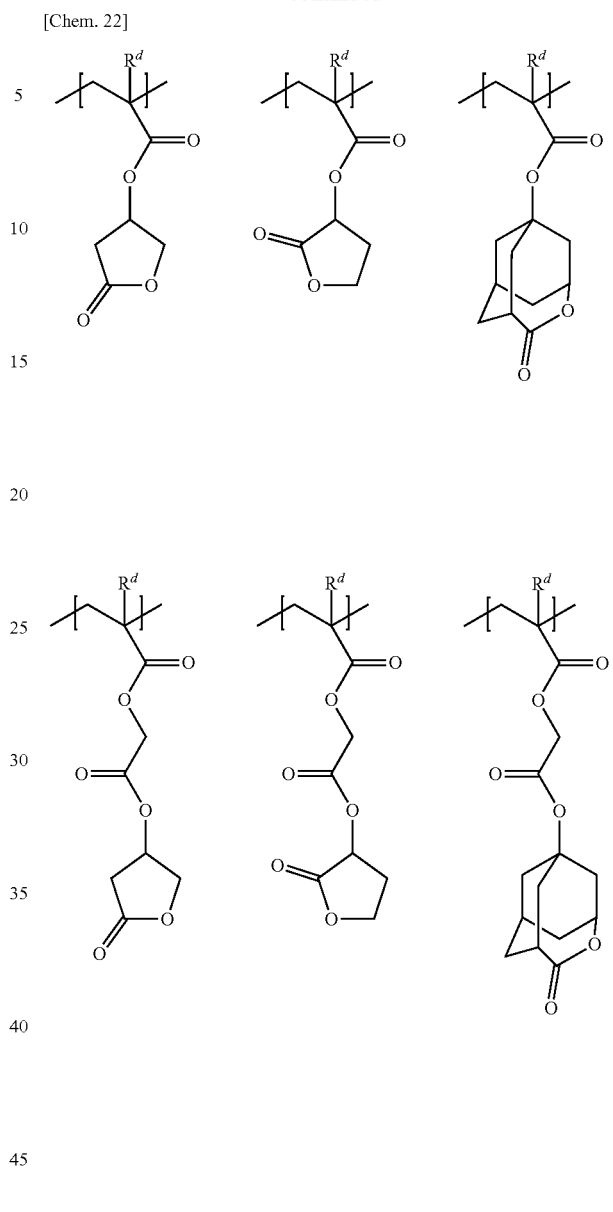

The resin according to an embodiment of the present invention may further have a monomer unit c. The monomer unit c is a polymerization unit represented by Formula (c1) below. When the resin according to an embodiment of the present invention contains the monomer unit c as a polymerization unit, high transparency and etching resistance can be imparted to the resin for a photoresist. In the formula, R represents a hydrogen atom, a halogen atom, or an alkyl group that has from 1 to 6 carbons and may have a halogen atom. A represents a single bond or a linking group. $R^b$ represents a hydroxy group that may be protected by a protecting group, a hydroxyalkyl group that may be protected by a protecting group, a carboxy group that may be protected by a protecting group, or a cyano group, and is preferably a hydroxy group or a cyano group among them. q represents an integer from 1 to 5. A ring $Z^2$ represents an alicyclic hydrocarbon ring having from 6 to 20 carbons. When q is an integer from 2 to 5, from 2 to 5 $R^b$'s may each be identical or different.

[Chem. 23]

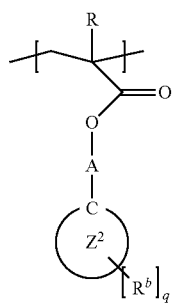

(c1)

[Chem. 24]

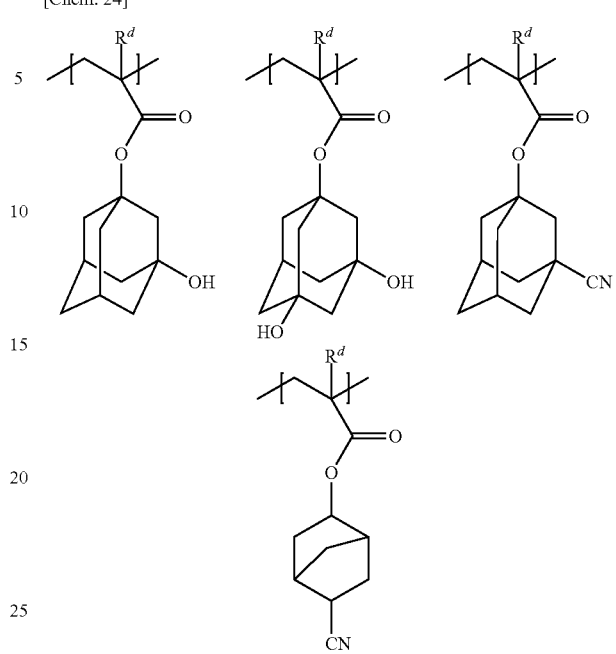

Examples of R and A in the polymerization unit represented by Formula (c1) include examples similar to those for R and A in the polymerization units represented by Formulas (a1) to (a4). In addition, for the groups in $R^b$ in the polymerization unit represented by Formula (c1), examples of the hydroxy group that may be protected by a protecting group, the hydroxyalkyl group that may be protected by a protecting group, and the carboxy group that may be protected by a protecting group include examples similar to those for the groups in $R^a$ in the polymerization units represented by Formulas (a1) to (a4).

The ring $Z^2$ in the polymerization unit represented by Formula (c1) represents an alicyclic hydrocarbon ring having from 6 to 20 carbons, and examples include: monocyclic alicyclic hydrocarbon rings, including approximately 6- to 20-membered (preferably from 6- to 15-membered and particularly preferably from 6- to 12-membered) cycloalkane rings, such as a cyclohexane ring and a cyclooctane ring, and approximately 6- to 20-membered (preferably from 6- to 15-membered and particularly preferably from 6- to 10-membered) cycloalkene rings, such as a cyclohexene ring; an adamantane ring; rings containing a norbornane ring or norbornene ring, such as a norbornane ring, a norbornene ring, a bornane ring, an isobornane ring, a tricyclo[5.2.1.0$^{2,6}$]decane ring, and a tetracyclo[4.4.0.1$^{2,5}$.1$^{7,10}$]dodecane ring; rings in which a polycyclic aromatic fused ring is hydrogenated (preferably a fully hydrogenated ring), such as a perhydroindene ring, a decalin ring (perhydronaphthalene ring), a perhydrofluorene ring (tricyclo[7.4.0.0$^{3,8}$]tridecane ring), and a perhydroanthracene ring; and approximately from bicyclic to hexacyclic bridged hydrocarbon rings, such as bridged hydrocarbon rings of a bicyclic system, tricyclic system, tetracyclic system, etc. (e.g., bridged hydrocarbon rings having approximately from 6 to 20 carbons), such as a tricyclo[4.2.2.1$^{2,5}$]undecane ring. Among them, the ring $Z^2$ is preferably a ring containing a norbornane ring or a norbornene ring; and an adamantane ring.

Specific examples of the monomer unit c include polymerization units represented by the formulas below. In the polymerization units represented by the formulas below, Rd represents a methyl group or a hydrogen atom. The monomer unit c can be introduced into the resin by polymerizing the corresponding unsaturated carboxylate.

The resin according to an embodiment of the present invention includes a polymerization unit represented by Formula (Y), and more preferably includes at least one monomer unit selected from the group consisting of the monomer unit a, the monomer unit b, and the monomer unit c. In this case, the content of the polymerization units represented by Formula (Y) in the resin according to an embodiment of the present invention is, for example, from 5 to 95 mol %, preferably from 10 to 90 mol %, more preferably from 20 to 80 mol %, and even more preferably from 30 to 60 mol %, based on the total amount of the monomer units (polymerization units) constituting the resin. Moreover, the content of the monomer unit a is, for example, from 10 to 90 mol %, preferably from 20 to 80 mol %, more preferably from 30 to 70 mol %, and even more preferably from 40 to 60 mol %, based on the total amount of the monomer units constituting the resin. Furthermore, the content of the monomer unit b when the resin according to an embodiment of the present invention contains the monomer unit b is, for example, from 0 to 80 mol %, preferably from 10 to 60 mol %, and more preferably from 20 to 50 mol %, based on the total amount of the monomer units constituting the resin. Furthermore, the content of the monomer unit c when the resin according to an embodiment of the present invention contains the monomer unit c is, for example, from 0 to 40 mol %, preferably from 1 to 30 mol %, and more preferably from 3 to 25 mol %, based on the total amount of the monomer units constituting the resin.

In addition, the weight average molecular weight (Mw) of the resin according to an embodiment of the present invention is from 1000 to 50000, preferably from 2000 to 30000, more preferably from 3000 to 20000, and particularly preferably from 4000 to 15000. The molecular weight distribution (ratio of the weight average molecular weight to the number average molecular weight: Mw/Mn) of the resin according to an embodiment of the present invention is not particularly limited as long as it is not greater than 2.5, and, for example, is from 1.0 to 2.2, and preferably from 1.0 to 2.0. Note that in the present specification, the weight average molecular weight (Mw) and the number average molecular weight (Mn) can be measured, for example, through GPC using polystyrene as a standard material, and is preferably measured by the method used in the examples.

The acid value of the resin according to an embodiment of the present invention is, for example, not greater than 0.10 mmol/g, preferably not greater than 0.05 mmol/g, and more preferably not greater than 0.03 mmol/g. When the acid value is not greater than 0.10 mmol/g, the acid degradable groups in the resin are protected without elimination, and therefore the resin according to an embodiment of the present invention exhibits excellent resist performance, and favorable stability over time. Note that the lower limit of the acid value is, for example, 0 mmol/g.

Method of Manufacturing Resin

The method of manufacturing the resin according to an embodiment of the present invention is not particularly limited, but examples include a dropwise polymerization method. Examples of the dropwise polymerization method include a method including adding the monomer or a solution containing the monomer dropwise in the presence of a polymerization initiator to polymerize the monomer. More specific examples include (1) adding dropwise a solution containing a polymerization initiator and a monomer, and (2) adding dropwise a monomer or a solution containing a monomer into a solution containing a polymerization initiator. The dropwise polymerization method may be performed in the presence of a chain transfer agent in addition to a polymerization initiator. Examples of monomers include monomers according to an embodiment of the present invention and monomers corresponding to the monomer unit a, the monomer unit b, and the monomer unit c.

A known radical polymerization initiator can be used as the polymerization initiator, and examples include azo-based compounds, peroxide-based compounds, and redox-based compounds, and particularly preferable examples include dimethyl-2,2'-azobisisobutyrate, azobisisobutyronitrile, 2,2'-azobis (2-methylbutyronitrile), t-butyl peroxypivalate, di-t-butyl peroxide, iso-butyryl peroxide, lauroyl peroxide, succinic acid peroxide, dicinnamyl peroxide, di-n-propyl peroxydicarbonate, t-butyl peroxyallyl monocarbonate, benzoyl peroxide, hydrogen peroxide, and ammonium persulfate.

An amount of the polymerization initiator to be used is any amount necessary to form a resin with a desired molecular weight distribution and is, for example, from 0.05 to 120 mol, preferably from 0.1 to 50 mol, and more preferably from 0.5 to 10 mol relative to the total amount (100 mol) of the monomers. In addition, the amount of the polymerization initiator to be used relative to the total amount (100 parts by weight) of the monomers is, for example, from 0.01 to 30 parts by weight, preferably from 0.2 to 20 parts by weight, and more preferably from 0.5 to 10 parts by weight.

A known chain transfer agent used for radical polymerization can be used as the chain transfer agent, and examples include thiols (such as n-dodecyl mercaptan, n-octyl mercaptan, n-butyl mercaptan, tert-butyl mercaptan, n-lauryl mercaptan, mercaptoethanol, mercaptopropanol, and triethylene glycol dimercaptan), thiol acids and their esters (such as mercaptopropionic acid, thiobenzoic acid, thioglycolic acid, thiomalic acid, and their alkyl esters), alcohols (such as isopropyl alcohol), amines (such as dibutylamine), hypophosphite salts (such as sodium hypophosphite), α-methylstyrene dimer, terpinolene, myrcene, limonene, α-pinene, and β-pinene.

An amount of the chain transfer agent to be used is not particularly limited but is preferably from 0.001 to 100 mol, more preferably from 0.01 to 50 mol, even more preferably from 0.1 to 30 mol, and particularly preferably from 1 to 10 mol relative to the total amount of the monomers (100 mol). In addition, the amount of the chain transfer agent to be used relative to the total amount (100 parts by weight) of the monomers is not particularly limited but is preferably from 0.1 to 100 parts by weight, more preferably from 0.5 to 50 parts by weight, and even more preferably from 1 to 25 parts by weight.

The polymerization may be performed without a solvent or may be performed in the presence of a polymerization solvent. Examples of the polymerization solvent include glycol-based solvents (the glycol-based compounds), ester-based solvents, ketone-based solvents, ether-based solvents, amide-based solvents, sulfoxide-based solvents, monohydric alcohol-based solvents (the monohydric alcohol-based compounds), hydrocarbon-based solvents, and mixed solvents thereof. Examples of the glycol solvents include, besides the glycol-based compounds, propylene glycol monomethyl ether acetate, ethylene glycol monomethyl ether acetate, ethylene glycol monoethyl ether acetate, and ethylene glycol monobutyl ether acetate. Examples of the ester-based solvent include lactate ester-based solvents, such as ethyl lactate; propionate ester-based solvents, such as methyl 3-methoxypropionate; acetate ester-based solvents, such as methyl acetate, ethyl acetate, propyl acetate, and butyl acetate. Examples of the ketone-based solvent include acetone, methyl ethyl ketone, methyl isobutyl ketone, methyl amyl ketone, cyclopentanone, and cyclohexanone. Examples of the ether-based solvent include linear ethers, such as diethyl ether, diisopropyl ether, dibutyl ether, and dimethoxyethane; and cyclic ethers, such as tetrahydrofuran and dioxane. Examples of the amide-based solvent include N,N-dimethylformamide. Examples of the sulfoxide-based solvent include dimethyl sulfoxide. Examples of the hydrocarbon-based solvent include aliphatic hydrocarbons, such as pentane, hexane, heptane, and octane; alicyclic hydrocarbons, such as cyclohexane and methylcyclohexane; and aromatic hydrocarbons, such as benzene, toluene, and xylene.

Preferred polymerization solvent include glycol-based solvents, such as propylene glycol monomethyl ether and propylene glycol monomethyl ether acetate; ester-based solvents, such as ethyl lactate; ketone-based solvents, such as acetone, methyl ethyl ketone, methyl isobutyl ketone, methyl amyl ketone, cyclopentanone, and cyclohexanone; and their mixed solvents.

The dropwise addition of the solution containing a monomer may be continuous dropwise addition (an aspect of adding dropwise over a certain period of time) or may be intermittent dropwise addition (an aspect of adding dropwise dividedly in multiple times).

Furthermore, the rate and the like of dropwise addition may be changed one or more times during dropwise addition.

The total dropwise addition time of the solution containing a monomer (the time from the start of dropwise addition to the completion of dropwise addition) varies depending on the polymerization temperature, the type of monomer, or the like but is, for example, preferably from 1 to 10 hours, more preferably from 2 to 9 hours, and even more preferably from 3 to 8 hours. The temperature of the solution containing a monomer to be added dropwise is preferably 40° C. or lower. The temperature of the solution containing a monomer not higher than 40° C. is more likely to prevent production of a polymer with too large molecular weight during the initial stage of the reaction. In addition, the solution containing a monomer, if excessively cooled, would crystallize depending on the type of monomer.

The polymerization temperature is not particularly limited but is, for example, from 30 to 150° C., preferably from 50 to 120° C., and more preferably from 60 to 100° C. Note that during polymerization, the polymerization temperature may be changed one or more times within the range of polymerization temperatures described above.

In the polymerization, time for aging may be provided after completion of the dropwise addition. The aging time is not particularly limited, but is, for example, preferably from 0.5 to 10 hours, and more preferably from 1 to 5 hours.

The polymer produced in the polymerization can be collected, for example, by precipitation (including reprecipitation). For example, the target polymer can be obtained by adding a polymerization solution (polymer dope) into a solvent (precipitation solvent) to precipitate the polymer; or dissolving the polymer once again in an appropriate solvent, and adding the solution into a solvent (reprecipitation solvent) to reprecipitate the polymer; or alternatively adding a solvent (reprecipitation solvent or polymerization solvent) into a polymerization solution (polymer dope) to dilute the polymerization solution. The precipitation or reprecipitation solvent may be either an organic solvent or water or may be a mixed solvent.

The precipitation or reprecipitation solvent is not particularly limited, and a known or commonly used solvent can be used. The precipitation or reprecipitation solvent may be the same solvent as the polymerization solvent described above or may be a different solvent. Examples of the precipitation or reprecipitation solvent include organic solvents exemplified as the polymerization solvent (glycol-based solvents, ester-based solvents, ketone-based solvents, ether-based solvents, amide-based solvents, sulfoxide-based solvents, monohydric alcohol-based solvents, and hydrocarbon-based solvents); halogenated hydrocarbons (halogenated aliphatic hydrocarbons, such as methylene chloride, chloroform, and carbon tetrachloride; and halogenated aromatic hydrocarbons, such as chlorobenzene and dichlorobenzene); nitro compounds (such as nitromethane and nitroethane); nitriles (such as acetonitrile and benzonitrile); carbonates (such as dimethyl carbonate, diethyl carbonate, ethylene carbonate, and propylene carbonate); carboxylic acids (such as acetic acid); and mixed solvents containing these solvents.

Among them, the precipitation or reprecipitation solvent is preferably a solvent containing at least a hydrocarbon (especially an aliphatic hydrocarbon, such as hexane or heptane) or an alcohol (especially such as methanol, ethanol, propanol, isopropyl alcohol, or butanol). In such a solvent containing at least a hydrocarbon, the ratio of the hydrocarbon (e.g., an aliphatic hydrocarbon, such as hexane or heptane) and an additional solvent (e.g., an ester, such as ethyl acetate) is, for example, the former/the latter (a volume ratio at 25° C.) of 10/90 to 99/1, preferably the former/the latter (a volume ratio at 25° C.) of 30/70 to 98/2, and more preferably the former/the latter (a volume ratio at 25° C.) of 50/50 to 97/3.

The precipitation or reprecipitation solvent is also preferably a mixed solvent of an alcohol (especially methanol) and water, or a mixed solvent of a glycol-based solvent (especially polyethylene glycol) and water. In this case, the ratio (volume ratio; 25° C.) of the organic solvent (alcohol or glycol-based solvent) to water is, for example, the organic solvent/water (volume ratio; 25° C.)=10/90 to 99/1, preferably the organic solvent/water (volume ratio; 25° C.)=30/70 to 98/2, and more preferably the organic solvent/water (volume ratio; 25° C.)=50/50 to 97/3.

The polymer obtained by precipitation (including reprecipitation) is subjected as necessary to rinsing or a treatment of loosening and dispersing the polymer in a solvent under stirring to wash the polymer (which may be referred to as "repulping"). The polymer may be subjected to rinsing after repulping. Repulping or rinsing the polymer produced by the polymerization with a solvent can efficiently remove a residual monomer, a low molecular weight oligomer, or the like adhered to the polymer.

In the manufacturing method according to an embodiment of the present invention, the solvent for repulping or rinsing is, among others, preferably a solvent containing at least a hydrocarbon (especially an aliphatic hydrocarbon, such as hexane or heptane), an alcohol (especially such as methanol, ethanol, propanol, isopropyl alcohol, or butanol), or an ester (especially such as ethyl acetate).

After the precipitation (including reprecipitation), repulping, or rinsing, the solvent may be removed, for example, by decantation, filtration, or the like as necessary, and may be dried.

Resin Composition

The resin composition according to an embodiment of the present invention contains at least the resin according to an embodiment of the present invention and a radiation-sensitive acid generator.

A commonly used or known compound that efficiently generates acid by exposure to radiation, such as visible light, ultraviolet light, far ultraviolet light, electron beams, or X-rays, can be used as the radiation-sensitive acid generator, and this is a compound composed of a base nucleus and an acid to be generated. Examples of the nucleus include onium salt compounds, such as iodonium salts, sulfonium salts (including tetrahydrothiophenium salts), phosphonium salts, diazonium salts, and pyridinium salts; sulfonimide compounds; sulfone compounds; sulfonate compounds; disulfonyldiazomethane compounds; disulfonylmethane compounds; oxime sulfonate compounds; and hydrazine sulfonate compounds. In addition, examples of the acid to be generated by the exposure include alkyl or fluorinated alkyl sulfonic acids, alkyl or fluorinated alkyl carboxylic acids, and alkyl or fluorinated alkyl sulfonyl imide acids. Only one of them may be used, or two or more may be used.

An amount of the radiation-sensitive acid generator to be used can be appropriately selected according to the strength of the acid to be generated by irradiation with radiation, the ratio of each repeating unit in the resin, or the like and can be selected, for example, from ranges of 0.1 to 30 parts by weight, preferably of 1 to 25 parts by weight, and even more preferably of 2 to 20 parts by weight relative to 100 parts by weight of the resin.

The resin composition can be prepared, for example, by mixing the resin and the radiation-sensitive acid generator in a solvent for a resist. Solvents such as a glycol-based solvent, an ester-based solvent, a ketone-based solvent, and a mixed solvent thereof exemplified as the polymerization solvent can be used as the solvent for a resist.

The resin concentration of the resin composition is, for example, from 3 to 40 wt. %. The resin composition may contain alkali-soluble component such as an alkali soluble resin (for example, a novolac resin, a phenolic resin, an imide resin, and a carboxy group-containing resin), a coloring agent (for example, a dye), and the like.

Pattern Forming Method

The resin composition according to an embodiment of the present invention is applied to a base material or substrate, dried, then the coating film (resist film) is exposed to light via a predetermined mask (or further subjected to post-exposure baking) to form a latent image pattern, then dissolved with alkali, and this can form a fine pattern with excellent heat resistance with high precision.

Examples of the base material or substrate include silicon wafers, metals, plastics, glass, and ceramics. The resin composition can be applied using a known application means such as a spin coater, dip coater, and roller coater. The thickness of the coating film is, for example, preferably from 0.05 to 20 μm and more preferably from 0.1 to 2 μm.

For the exposure, a radiation, such as a visible light, an ultraviolet light, a far-ultraviolet light, an electron beam, or an X-ray, can be used.

An acid is generated from the radiation-sensitive acid generator by exposure, and the acid readily promotes elimination of a protecting group (acid degradable group), such as a carboxy group of a polymerization unit of the resin composition (repeating unit having an acid degradable group) that becomes alkaline soluble by the action of an acid, and thereby a carboxy group or the like that contributes to solubilization is produced. As a result, the predetermined pattern can be formed with good precision by development with an alkaline developing solution.

EXAMPLES

Hereinafter, the present invention will be described in more detail based on examples, but the present invention is not limited by these examples. The weight average molecular weight (Mw) and the number average molecular weight (Mn) of the resin were determined by gel permeation chromatography (GPC) measurement using a tetrahydrofuran solvent. Polystyrene was used for a standard sample, and a refractometer (refractive index detector; RI detector) was used as a detector. In addition, the GPC measurement was performed using three columns (trade name "KF-806L"), available from Showa Denko K.K., connected in series under conditions of a column temperature of 40° C., an RI temperature of 40° C., and a tetrahydrofuran flow rate of 0.8 mL/min. The molecular weight distribution (Mw/Mn) was calculated from the measurements.

Example 1 (Preparation of Monomer A)

In 200 mL of toluene, 50 g (0.33 mol) of ethyl 2-cyanoacrylate was dissolved, and 45 g (0.68 mol) of 1,3-cyclopentadiene was added under cooling at a temperature of 35° C. or lower. The mixture was stirred for 1 hour and then concentrated, and 72 g of ethyl 5-cyanobicyclo[2.2.1]heptane-2-ene-5-carboxylate (a crude product) was obtained.

In 501 g of methylene chloride, 69 g (0.36 in terms of mol) of ethyl 5-cyanobicyclo[2.2.1]heptane-2-ene-5-carboxylate (a crude product) obtained above was dissolved, and 115 g of m-chloroperbenzoic acid (m-CPBA) was slowly charged under cooling to 5° C. or lower. After 4 hours, an aqueous sodium sulfite solution was added to decompose excess peroxide, and then the organic layer was washed with an aqueous sodium bicarbonate solution. The organic layer was charged with 150 g of formic acid and 303 g of water, the temperature was raised to 50° C., and stirring was continued for 4 hours. The aqueous layer was extracted with ethyl acetate until no product was present from the aqueous layer. The organic layers were combined and concentrated, and 23 g of 1-cyano-5-hydroxy-3-oxatricyclo[4.2.1.0$^{4,8}$] nonane-2-on (a crude product) was obtained.

In 200 g of THF, 20 g (0.11 in terms of mol) of 1-cyano-5-hydroxy-3-oxatricyclo[4.2.1.0$^{4,8}$] nonane-2-one (a crude product) was dissolved, and 1.37 g of N,N-dimethyl-4-aminopyridine (DMAP), 25 g of sodium 2-fluoroacrylate, 10.0 mg of phenothiazine, and 10.8 mg of methoquinone were added. The solution was heated to 40° C., then 43 g of 1-ethyl-3-(3-dimethylaminopropyl) carbodiimide hydrochloride (EDCI·HCl) was added in five portions, and the mixture was stirred at 40° C. for 2 hours. Then, 13 g of EDCI·HCl and 7.6 g of sodium 2-fluoroacrylate were added, and the mixture was stirred at 40° C. for 3 hours. After 364 g of 1 N hydrochloric acid was added, 200 g ethyl acetate was added to separate the organic phase. The organic phase was then washed with 200 g water, with 117 g of an 8% aqueous sodium bicarbonate solution, twice with 200 g of a 2% aqueous sodium bicarbonate solution, and with 200 g of water, in this order, then dried and concentrated (35° C., 70 Torr), and 26 g of a crude product was obtained. This was purified by crystallization with an acetonitrile/2-propanol mixed solvent, and 19.0 g of monomer A represented by the formula below was obtained. Yield was 68%.

[Chem. 25]

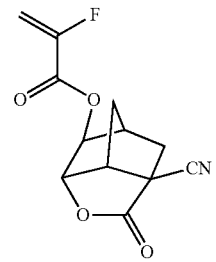

Example 2 (Preparation of Resin A)

Into a round-bottom flask equipped with a reflux tube, a stirring bar, and a three-way cock, 27.64 g of cyclohexanone was placed under a nitrogen atmosphere, and the temperature was maintained at 80° C. A solution prepared by mixing 30.00 g (0.12 mol) of monomer A, 2.10 g of dimethyl-2,2'-azobisisobutyrate (trade name "V-601", available from Wako Pure Chemical Industries, Ltd.), and 156.64 g of cyclohexanone was added dropwise at a constant rate under stirring over 6 hours. After completion of the dropwise addition, the reaction solution was continuously stirred for another 2 hours.

After completion of the polymerization reaction, the reaction solution was added dropwise under stirring into a mixed liquid (25° C.) of heptane and ethyl acetate (7:3 in a weight ratio), the amount of the mixed liquid being 14 times the amount of the reaction solution. The resulting precipitate was filtered off and dried under reduced pressure, and 20.0 g of resin A was obtained. The collected resin A as analyzed by GPC had a weight average molecular weight (Mw) of 10200 and a molecular weight distribution (Mw/Mn) of 1.64.

Resin A has a polymerization unit represented by the formula below.

[Chem. 26]

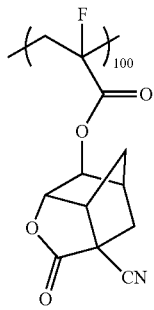

Example 3 (Preparation of Resin B)

Into a round-bottom flask equipped with a reflux tube, a stirring bar, and a three-way cock, 13.67 g of propylene glycol monomethyl ether acetate and 13.67 g of methyl ethyl ketone were placed under a nitrogen atmosphere, and the temperature was maintained at 80° C. A solution prepared by mixing 16.33 g (0.07 mol) of monomer A, 13.67 g (0.07 mol) of 1-(1-cyclohexyl)-1-methylethyl=methacrylate, 3.60 g of dimethyl-2,2'-azobisisobutyrate, 54.67 g of propylene glycol monomethyl ether acetate, and 54.67 g of methyl ethyl ketone was added dropwise at a constant rate under stirring over 6 hours. After completion of the dropwise addition, the reaction solution was continuously stirred for another 2 hours.

After completion of the polymerization reaction, the reaction solution was added dropwise under stirring into a mixed liquid (25° C.) of heptane and ethyl acetate (8:2 in a weight ratio), the amount of the mixed liquid being 14 times the amount of the reaction solution. The resulting precipitate was filtered off and dried under reduced pressure, and 29.1 g of resin B was obtained. The collected resin B as analyzed by GPC had a weight average molecular weight (Mw) of 5800 and a molecular weight distribution (Mw/Mn) of 1.56.

Resin B has polymerization units represented by the formulas below.

[Chem. 27]

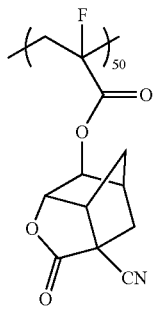

-continued

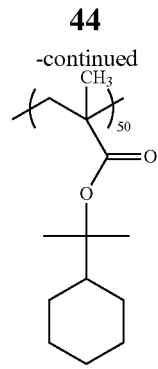

Comparative Example 1 (Preparation of Resin C)

Into a round-bottom flask equipped with a reflux tube, a stirring bar, and a three-way cock, 27.64 g of cyclohexanone was placed under a nitrogen atmosphere, and the temperature was maintained at 80° C. A mixed solution of 30.00 g (0.12 mol) of 6-cyano-5-oxo-4-oxatricyclo[4.2.1.0$^{3,7}$] nonan-2-yl=methacrylate, 1.50 g of dimethyl-2,2'-azobisisobutyrate, and 156.64 g of cyclohexanone was added dropwise at a constant rate under stirring over 6 hours. After completion of the dropwise addition, the reaction solution was continuously stirred for another 2 hours.

After completion of the polymerization reaction, the reaction solution was added dropwise under stirring into a mixed liquid (25° C.) of heptane and ethyl acetate (7:3 in a weight ratio), the amount of the mixed liquid being 14 times the amount of the reaction solution. The resulting precipitate was filtered off and dried under reduced pressure, and 22.9 g of resin C was obtained. The collected polymer as analyzed by GPC had a weight average molecular weight (Mw) of 9900 and a molecular weight distribution (Mw/Mn) of 1.70.

Resin C has a polymerization unit represented by the formula below.

[Chem. 28]

Comparative Example 2 (Preparation of Resin D)

Into a round-bottom flask equipped with a reflux tube, a stirring bar, and a three-way cock, 13.67 g of propylene glycol monomethyl ether acetate and 13.67 g of methyl ethyl ketone were placed under a nitrogen atmosphere, and the temperature was maintained at 80° C. A mixed solution of 16.21 g (0.07 mol) of 6-cyano-5-oxo-4-oxatricyclo[4.2.1.0$^{3,7}$] nonan-2-yl=methacrylate, 13.79 (0.07 mol) g of 1-(1-cyclohexyl)-1-methylethyl=methacrylate, 3.60 g of dimethyl-2,2'-azobisisobutyrate, 54.67 g of propylene glycol monomethyl ether acetate, and 54.67 g of methyl ethyl ketone was added dropwise at a constant rate under stirring over 6 hours. After completion of the dropwise addition, the reaction solution was continuously stirred for another 2 hours.

After completion of the polymerization reaction, the reaction solution was added dropwise under stirring into a mixed liquid (25° C.) of heptane and ethyl acetate (8:2 in a weight ratio), the amount of the mixed liquid being 14 times the amount of the reaction solution. The resulting precipitate was filtered off and dried under reduced pressure, and 24.4 g of resin D was obtained. The collected polymer as analyzed by GPC had a weight average molecular weight (Mw) of 6400 and a molecular weight distribution (Mw/Mn) of 1.52.

Resin D has polymerization units represented by the formulas below.

[Chem. 29]

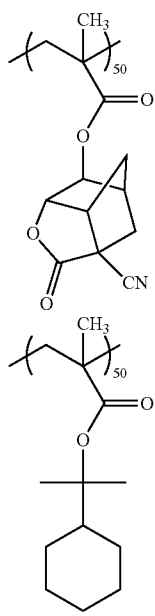

Evaluation of Heat Resistance

Figure 2:
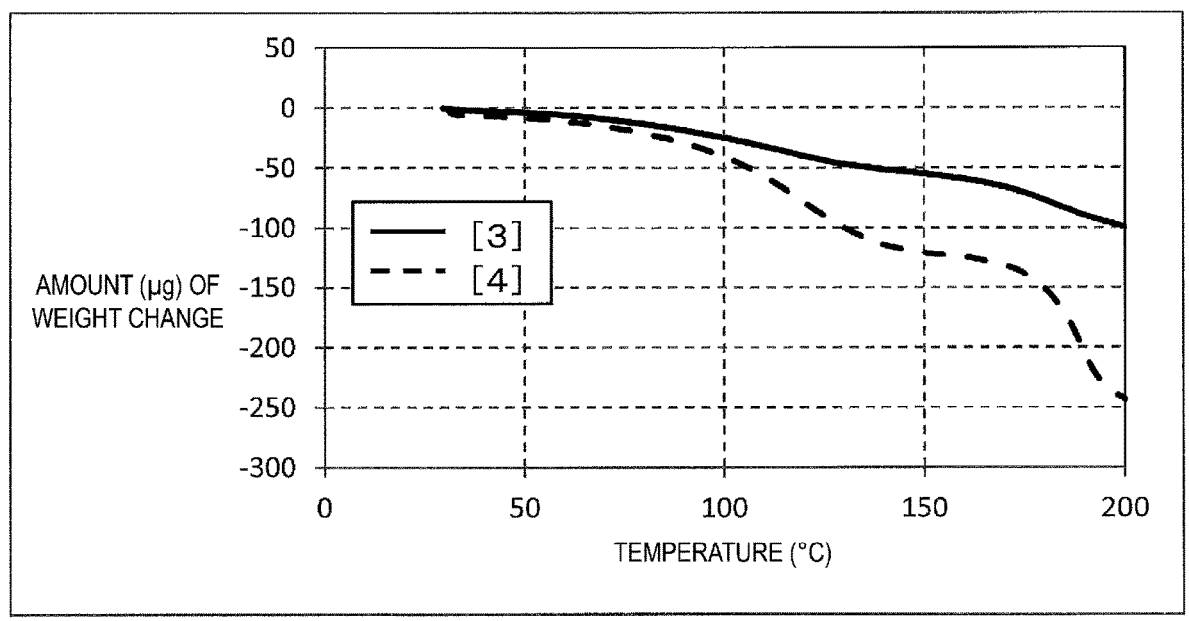
FIG. 2 is a graph showing results of thermogravimetric measurements of resins in Example 3 and Comparative Example 2. The solid line [3] shows results of Example 3, and the dashed line [4] shows results of Comparative Example 2. The vertical axis shows the amount (ug) of weight change, and the horizontal axis shows the temperature (° C.).

Resins A to D obtained in Examples 2 and 3 and Comparative Examples 1 and 2 were thermogravimetrically measured with a TG-DTA6200 available from Hitachi High-Tech Science Corporation. The results of Example 2 and Comparative Example 1 are shown in FIG. 1, and the results of Example 3 and Comparative Example 2 are shown in FIG. 2. The evaluation conditions were as follows.

Temperature range: from 30 to 350° C. (Example 2 and Comparative Example 1), 30 to 200° C. (Example 3 and Comparative Example 2)

Rate of temperature increase: 20° C./min.

As can be seen from the evaluation results (FIGS. 1 and 2), the resins according to an embodiment of the present invention did not decompose even under high-temperature conditions and had excellent heat resistance. Thus, the resin for a photoresist according to an embodiment of the present invention is expected to have excellent resist performance.

To summarize the above, configurations and variations of the present invention are described below.

(1) A resin for a photoresist, the resin containing a polymerization unit represented by Formula (Y), where $R^h$ represents a halogen atom or an alkyl group having from 1 to 6 carbons and having a halogen atom; $R^1$ is a substituent attached to a ring and represents a halogen atom, an alkyl group that has from 1 to 6 carbons and may have a halogen atom, a hydroxyalkyl group that has from 1 to 6 carbons and may have a halogen atom and has a hydroxyl group moiety which may be protected by a protecting group, a carboxyl group that may form a salt, or a substituted oxycarbonyl group; A represents an alkylene group having from 1 to 6 carbons, an oxygen atom, a sulfur atom, or no bond; m is the number of $R^1$ and represents an integer from 0 to 8; X represents an electron-withdrawing substituent; n is the number of X and represents an integer from 1 to 9; B represents a single bond or a linking group; and a steric position of a COOB-group attached to a polymer chain may be either endo or exo.

(2) The resin for a photoresist according to (1), in which the halogen atom in $R^h$ is a fluorine atom or a chlorine atom.

(3) The resin for a photoresist according to (1) or (2), in which the alkyl group having from 1 to 6 carbons and having a halogen atom in $R^h$ is a fluoromethyl group, a difluoromethyl group, a trifluoromethyl group, a 2,2,2-trifluoroethyl group, or a 1,1,2,2,2-pentafluoroethyl group.

(4) The resin for a photoresist according to any one of (1) to (3), in which X is at least one type selected from the group consisting of halogen atoms, such as a fluorine atom; halogenated hydrocarbon groups, such as a trifluoromethyl group; a carboxyl group; alkoxycarbonyl groups, such as a methoxycarbonyl group; aryloxycarbonyl groups, such as a phenoxycarbonyl group; acyl groups, such as an acetyl group; a cyano group; aryl groups; 1-alkenyl groups; a nitro group; alkyl sulfonate groups; sulfonic acids; sulfone groups; and sulfoxy groups.

(5) The resin for a photoresist according to any one of (1) to (4), in which X is attached to the 1-position (α-position of lactone) or 2-position of a 6-oxabicyclo[3.2.1$^{1,5}$] octane ring.

(6) The resin for a photoresist according to any one of (1) to (5), in which A is an alkylene group having from 1 to 6 carbons, an oxygen atom, or a sulfur atom; and X is attached to the 1- or 9-position (or a position corresponding to these) of a 3-oxatricyclo[4.2.1.0$^{4,8}$] nonane ring or the like.

(7) The resin for a photoresist according to any one of (1) to (6), further containing at least one type of polymerization unit selected from the group consisting of polymerization units represented by Formulas (a1) to (a4), where R represents a hydrogen atom, a halogen atom, or an alkyl group that has from 1 to 6 carbons and may have a halogen atom; A represents a single bond or a linking group; $R^2$ to $R^4$ are identical or different and represent an alkyl group that has from 1 to 6 carbons and may have a substituent, where $R^2$ and $R^3$ may be bonded to each other to form a ring; $R^5$ and $R^6$ are identical or different and represent a hydrogen atom or an alkyl group that has from 1 to 6 carbons and may have a substituent; $R^7$ represents a —COOR$^e$ group, and the R$^e$ represents a tertiary hydrocarbon group that may have a substituent, a tetrahydrofuranyl group, a tetrahydropyranyl group, or an oxepanyl group; n represents an integer from 1 to 3; $R^a$ is a substituent attached to a ring $Z^1$, the substituents being identical or different, and represents an oxo group, an alkyl group, a hydroxy group that may be protected by a protecting group, a hydroxyalkyl group that may be protected by a protecting group, or a carboxy group that may be protected by a protecting group; p represents an integer from 0 to 3; and the ring $Z^1$ represents an alicyclic hydrocarbon ring having from 3 to 20 carbons.

(8) The resin for a photoresist according to (7), in which a content of at least one type of polymerization unit selected from the group consisting of polymerization units represented by Formulas (a1) to (a4) above is from 10 to 90 mol %, from 20 to 80 mol %, from 30 to 70 mol %, or from 40 to 60 mol % relative to all monomer units constituting the resin.

(9) The resin for a photoresist according to any one of (1) to (8), further containing at least one type of polymerization unit selected from the group consisting of polymerization units represented by Formulas (b1) to (b5), with the proviso that the polymerization unit corresponding to the polymerization unit represented by Formula (Y) is excluded, where R represents a hydrogen atom, a halogen atom, or an alkyl group that has from 1 to 6 carbons and may have a halogen atom; A represents a single bond or a linking group; X represents no bond, a methylene group, an ethylene group, an oxygen atom, or a sulfur atom; Y represents a methylene group or a carbonyl group; Z represents a divalent organic group; $V^1$ to $V^3$ are identical or different and represent —CH$_2$—, [—C(=O)—], or [—C(=O)—O—] with the proviso that at least one of $V^1$ to $V^3$ is [—C(=O)—O—]; and $R^8$ to $R^{14}$ are identical or different and represent a hydrogen atom, a fluorine atom, an alkyl group that may have a fluorine atom, a hydroxy group that may be protected by a protecting group, a hydroxyalkyl group that may be protected by a protecting group, a carboxy group that may be protected by a protecting group, or a cyano group.

(10) The resin for a photoresist according to (9), in which a content of at least one type of polymerization unit selected from the group consisting of polymerization units represented by Formulas (b1) to (b5) above is from 0 to 80 mol %, from 10 to 60 mol %, or from 20 to 50 mol % relative to all monomer units constituting the resin.

(11) The resin for a photoresist according to any one of (1) to (10), further containing a polymerization unit represented by Formula (c1), where R represents a hydrogen atom, a halogen atom, or an alkyl group that has from 1 to 6 carbons and may have a halogen atom; A represents a single bond or a linking group; $R^b$ represents a hydroxy group that may be protected by a protecting group, a hydroxyalkyl group that may be protected by a protecting group, a carboxy group that may be protected by a protecting group, or a cyano group; q represents an integer from 1 to 5; and a ring $Z^2$ represents an alicyclic hydrocarbon ring having from 6 to 20 carbons.

(12) The resin for a photoresist according to (11), in which a content of the polymerization unit represented by Formula (c1) above is from 0 to 40 mol %, from 1 to 30 mol %, or from 3 to 25 mol % relative to all monomer units constituting the resin.

(13) The resin for a photoresist according to any one of (1) to (12), in which a content of the polymerization unit represented by Formula (Y) is from 5 to 95 mol %, from 10 to 90 mol %, from 20 to 80 mol %, or from 30 to 60 mol % relative to all monomer units (polymerization units) constituting the resin.

(14) The resin for a photoresist according to any one of (1) to (13), in which a weight average molecular weight (Mw) is from 1000 to 50000, from 2000 to 30000, from 3000 to 20000, or from 4000 to 15000.

(15) The resin for a photoresist according to any one of (1) to (14), in which a molecular weight distribution (ratio of weight average molecular weight to number average molecular weight: Mw/Mn) is 2.5 or lower, from 1.0 to 2.2, or from 1.0 to 2.0.

(16) A resin composition for a photoresist, the resin composition containing at least the resin for a photoresist described in any one of (1) to (15) and a radiation-sensitive acid generator.

(17) A pattern forming method including at least: applying the resin composition for a photoresist described in (16) to a substrate to form a coating film; exposing the coating film to light; and then dissolving the coating film with alkali.

(18) A monomer represented by Formula (X), where $R^h$ represents a halogen atom or an alkyl group having from 1 to 6 carbons and having a halogen atom; $R^1$ is a substituent attached to a ring and represents a halogen atom, an alkyl group that has from 1 to 6 carbons and may have a halogen atom, a hydroxyalkyl group that has from 1 to 6 carbons and may have a halogen atom and has a hydroxyl group moiety which may be protected by a protecting group, a carboxyl group that may form a salt, or a substituted oxycarbonyl group; A represents an alkylene group having from 1 to 6 carbons, an oxygen atom, a sulfur atom, or no bond; m is the number of $R^1$ and represents an integer from 0 to 8; X represents an electron-withdrawing substituent; n is the number of X and represents an integer from 1 to 9; B represents a single bond or a linking group; and a steric position of a CH$_2$=C($R^h$)COOB-group may be either endo or exo.

(19) The monomer according to (18), in which the halogen atom in $R^h$ is a fluorine atom or a chlorine atom.

(20) The monomer according to (18) or (19), in which the alkyl group having from 1 to 6 carbons and having a halogen atom in $R^h$ is a fluoromethyl group, a difluoromethyl group, a trifluoromethyl group, a 2,2,2-trifluoroethyl group, or a 1,1,2,2,2-pentafluoroethyl group.

(21) The monomer according to any one of (18) to (20), in which X (an electron-withdrawing group) is at least one type selected from the group consisting of halogen atoms, such as a fluorine atom; halogenated hydrocarbon groups, such as a trifluoromethyl group; a carboxyl group; alkoxycarbonyl groups, such as a methoxycarbonyl group; aryloxycarbonyl groups, such as a phenoxycarbonyl group; acyl groups, such as an acetyl group; a cyano group; aryl groups; 1-alkenyl groups; a nitro group; alkyl sulfonate groups; sulfonic acids; sulfone groups; and sulfoxy groups.

(22) The monomer according to any one of (18) to (21), in which X is attached to the 1-position (α-position of lactone) or 2-position of a 6-oxabicyclo[3.2.1$^{1,5}$] octane ring.

(23) The monomer according to any one of (18) to (22), in which A is an alkylene group having from 1 to 6 carbons, an oxygen atom, or a sulfur atom; and X is attached to the 1- or 9-position (or α position corresponding to these) of a 3-oxatricyclo[4.2.1.0$^{4,8}$] nonane ring or the like.

INDUSTRIAL APPLICABILITY

The present invention provides the monomer that improves solubility in organic solvents and hydrolyzability of a resin as well as imparts higher heat resistance to a resin. In addition, the present invention provides the resin having high solubility in organic solvents and high hydrolyzability as well as having higher heat resistance; and the resin composition containing the resin. Furthermore, the present invention provides the method that can form a fine pattern with good precision using the resin composition.

The invention claimed is:

1. A resin for a photoresist, the resin comprising a polymerization unit represented by Formula (Y):

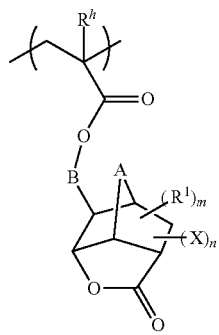

(Y)

where $R^h$ represents a fluorine atom; $R^1$ is a substituent attached to a ring and represents a halogen atom, an alkyl group that has from 1 to 6 carbons and may have a halogen atom, a hydroxyalkyl group that has from 1 to 6 carbons and may have a halogen atom and has a hydroxyl group moiety which may be protected by a protecting group, a carboxyl group that may form a salt, or a substituted oxycarbonyl group; A represents an alkylene group having from 1 to 6 carbons; m is the number of $R^1$ and represents an integer from 0 to 8; X is a cyano group; n is the number of X and represents an integer from 1 to 9; B represents a single bond; and a steric position of a COOB-group attached to a polymer chain may be either endo or exo.

2. The resin for a photoresist according to claim 1, further comprising at least one type of polymerization unit selected from the group consisting of polymerization units represented by Formulas (a1) to (a4):

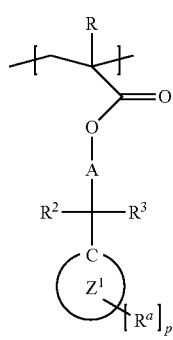

(a1)

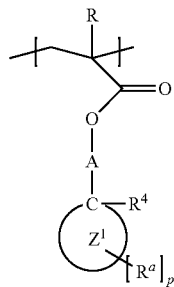

(a2)

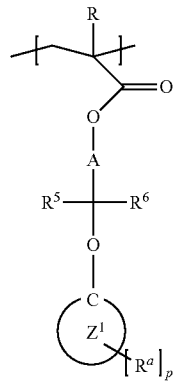

(a3)

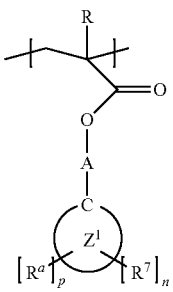

(a4)

where R represents a hydrogen atom, a halogen atom, or an alkyl group that has from 1 to 6 carbons and may have a halogen atom; A represents a single bond or a linking group; $R^2$ to $R^4$ are identical or different and represent an alkyl group that has from 1 to 6 carbons and may have a substituent, where $R^2$ and $R^3$ may be bonded to each other to form a ring; $R^5$ and $R^6$ are identical or different and represent a hydrogen atom or an alkyl group that has from 1 to 6 carbons and may have a substituent; $R^7$ represents a —$COOR^c$ group, and the $R^c$ represents a tertiary hydrocarbon group that may have a substituent, a tetrahydrofuranyl group, a tetrahydropyranyl group, or an oxepanyl group; n represents an integer from 1 to 3; $R^a$ is a substituent attached to a ring $Z^1$, the substituents being identical or different, and represents an oxo group, an alkyl group, a hydroxy group that may be protected by a protecting group, a hydroxyalkyl group that may be protected by a protecting group, or a carboxy group that may be protected by a protecting group; p represents an integer from 0 to 3; and the ring $Z^1$ represents an alicyclic hydrocarbon ring having from 3 to 20 carbons.

3. The resin for a photoresist according to claim 1, further comprising at least one type of polymerization unit selected from the group consisting of polymerization units represented by Formulas (b1) to (b5) with the proviso that the polymerization unit corresponding to the polymerization unit represented by Formula (Y) is excluded:

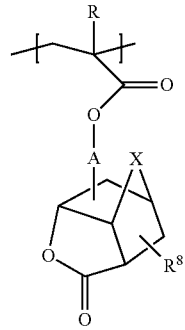
(b1)

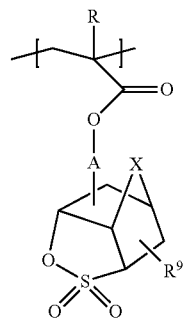
(b2)

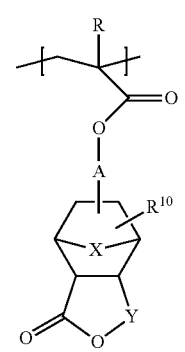
(b3)

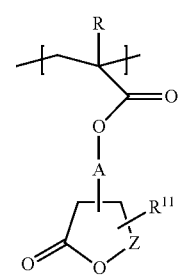
(b4)

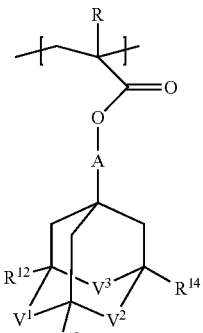
(b5)

where R represents a hydrogen atom, a halogen atom, or an alkyl group that has from 1 to 6 carbons and may have a halogen atom; A represents a single bond or a linking group; X represents no bond, a methylene group, an ethylene group, an oxygen atom, or a sulfur atom; Y represents a methylene group or a carbonyl group; Z represents a divalent organic group; $V^1$ to $V^3$ are identical or different and represent —$CH_2$—, [—C(=O)—], or [—C(=O)—O—] with the proviso that at least one of $V^1$ to $V^3$ is [—C(=O)—O—]; and $R^8$ to $R^{14}$ are identical or different and represent a hydrogen atom, a fluorine atom, an alkyl group that may have a fluorine atom, a hydroxy group that may be protected by a protecting group, a hydroxyalkyl group that may be protected by a protecting group, a carboxy group that may be protected by a protecting group, or a cyano group.

4. The resin for a photoresist according to claim 1, further comprising a polymerization unit represented by Formula (c1):

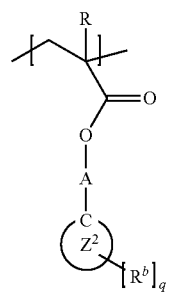
(c1)

wherein R represents a hydrogen atom, a halogen atom, or an alkyl group that has from 1 to 6 carbons and may have a halogen atom; A represents a single bond or a linking group; $R^b$ represents a hydroxy group that may be protected by a protecting group, a hydroxyalkyl group that may be protected by a protecting group, a carboxy group that may be protected by a protecting group, or a cyano group; q represents an integer from 1 to 5; and a ring $Z^2$ represents an alicyclic hydrocarbon ring having from 6 to 20 carbons.

5. A resin composition for a photoresist, the resin composition comprising at least the resin for a photoresist described in claim 1 and a radiation-sensitive acid generator.

6. A pattern forming method comprising at least: applying the resin composition for a photoresist described in claim 5 to a substrate to form a coating film; exposing the coating film to light; and then dissolving the coating film with alkali.

7. A monomer represented by Formula (X):

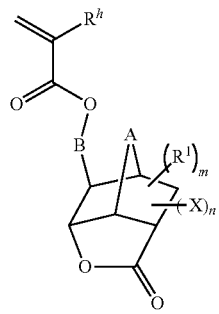

(X)

where $R^h$ represents a fluorine atom; $R^1$ is a substituent attached to a ring and represents a halogen atom, an alkyl group that has from 1 to 6 carbons and may have a halogen atom, a hydroxyalkyl group that has from 1 to 6 carbons and may have a halogen atom and has a hydroxyl group moiety which may be protected by a protecting group, a carboxyl group that may form a salt, or a substituted oxycarbonyl group; A represents an alkylene group having from 1 to 6 carbons; m is the number of $R^1$ and represents an integer from 0 to 8; X is a cyano group; n is the number of X and represents an integer from 1 to 9; B represents a single bond; and a steric position of a $CH_2$=$C(R^h)COOB$— group may be either endo or exo.

8. The resin for a photoresist according to claim 1, wherein X is attached to the 1-position of a 3-oxatricyclo [$4.2.1.0^{4,8}$] nonane ring.

9. The resin for a photoresist according to claim 1, wherein a weight average molecular weight (Mw) is from 1000 to 50000.

10. The resin for a photoresist according to claim 1, wherein a molecular weight distribution (ratio of weight average molecular weight to number average molecular weight: Mw/Mn) is 2.5 or lower.

11. The resin for a photoresist according to claim 2, further comprising at least one type of polymerization unit selected from the group consisting of polymerization units represented by Formulas (b1) to (b5) with the proviso that the polymerization unit corresponding to the polymerization unit represented by Formula (Y) is excluded:

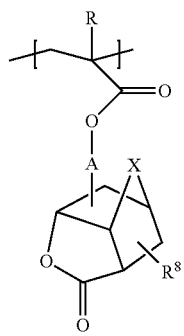

(b1)

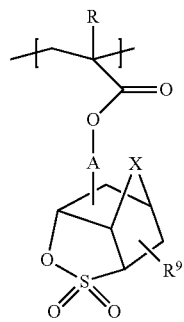

(b2)

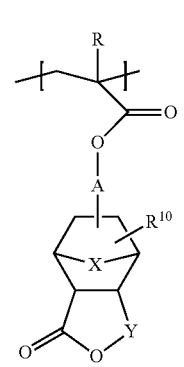

(b3)

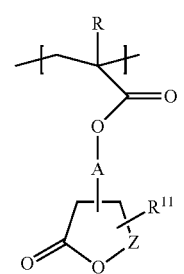

(b4)

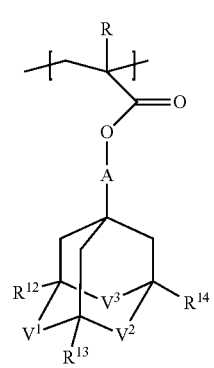

(b5)

where R represents a hydrogen atom, a halogen atom, or an alkyl group that has from 1 to 6 carbons and may have a halogen atom; A represents a single bond or a linking group; X represents no bond, a methylene group, an ethylene group, an oxygen atom, or a sulfur atom; Y represents a methylene group or a carbonyl group; Z represents a divalent organic group; $V^1$ to $V^3$ are identical or different and represent —CH$_2$—, [—C(=O)—], or [—C(=O)—O—] with the proviso that at least one of $V^1$ to $V^3$ is [—C(=O)—O—]; and $R^8$ to $R^{14}$ are identical or different and represent a hydrogen atom, a fluorine atom, an alkyl group that may have a fluorine atom, a hydroxy group that may be protected by a protecting group, a hydroxyalkyl group that may be protected by a protecting group, a carboxy group that may be protected by a protecting group, or a cyano group.

12. The monomer according to claim 7, wherein X is attached to the 1-position of a 3-oxatricyclo[4.2.1.0$^{4,8}$] nonane ring.

13. The resin for a photoresist according to claim 1, the polymerization unit represented by Formula:

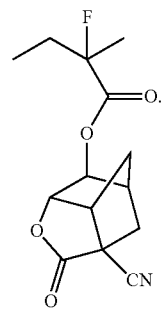 [SMILES: CCC(C)(F)C(=O)OC1C2CC3C1OC(=O)C3(C#N)C2]

14. The monomer according to claim 7 represented by Formula:

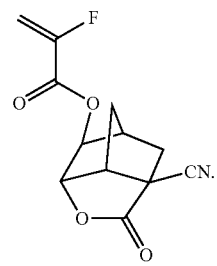 [SMILES: C=C(F)C(=O)OC1C2CC3C1OC(=O)C3(C#N)C2]

* * * * *